United States Patent
Chiu et al.

(10) Patent No.: US 10,714,491 B2
(45) Date of Patent: Jul. 14, 2020

(54) MEMORY DEVICE AND MANUFACTURING METHOD THEREOF

(71) Applicant: MACRONIX International Co., Ltd., Hsinchu (TW)

(72) Inventors: Chien-Lan Chiu, Yunlin County (TW); Chun-Min Cheng, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/104,117

(22) Filed: Aug. 16, 2018

(65) Prior Publication Data

US 2020/0058666 A1 Feb. 20, 2020

(51) Int. Cl.
| H01L 27/11556 | (2017.01) |
| H01L 27/11524 | (2017.01) |
| H01L 27/1157  | (2017.01) |
| H01L 27/11582 | (2017.01) |

(52) U.S. Cl.
CPC .... H01L 27/11556 (2013.01); H01L 27/1157 (2013.01); H01L 27/11524 (2013.01); H01L 27/11582 (2013.01)

(58) Field of Classification Search
CPC .......... H01L 21/28282; H01L 27/0688; H01L 27/792; H01L 27/11521; H01L 27/11524; H01L 27/11551; H01L 27/11556; H01L 27/1157; H01L 27/11582; H01L 27/11597; H01L 27/2409; H01L 27/2454; H01L 27/2481; H01L 27/249; H01L 27/7926; H01L 29/66833
See application file for complete search history.

(56) References Cited

U.S. PATENT DOCUMENTS

| 9,269,719    | B2 * | 2/2016 | Lee      | H01L 27/11556 |
| 2015/0097222 | A1 * | 4/2015 | Lee      | H01L 27/1157  |
|              |      |        |          | 257/314       |
| 2017/0243651 | A1 * | 8/2017 | Choi     | H01L 27/11565 |
| 2017/0278571 | A1 * | 9/2017 | Chowdhury| G11C 16/0483  |

* cited by examiner

*Primary Examiner* — David C Spalla
(74) *Attorney, Agent, or Firm* — J.C. Patents

(57) ABSTRACT

A memory device and manufacturing method thereof are provided. The memory device includes a pair of stacked structures, a charge storage layer, and a channel layer. The stacked structures are disposed on a substrate. Each stacked structure includes gate layers and insulating layers stacked alternately, and a cap layer on the gate layers and the insulating layers. The charge storage layer is disposed on sidewalls of the stacked structures facing each other. The channel layer covers the charge storage layer, and has a top portion, a body portion, and a bottom portion. The top portion covers sidewalls of the cap layers of the stacked structures. The bottom portion covers a portion of the substrate located between the stacked structures. The body portion is connected between the top and bottom portions. Dopant concentrations of the top and bottom portions are respectively greater than a dopant concentration of the body portion.

14 Claims, 19 Drawing Sheets

MEMORY DEVICE AND MANUFACTURING METHOD THEREOF

BACKGROUND OF THE INVENTION

Field of the Invention

The embodiments of the invention relate to a semiconductor device and a manufacturing method thereof, and more particularly, to a memory device and a manufacturing method thereof.

Description of Related Art

The flash memory is a type of non-volatile memory, and has gradually become one of the mainstream storage media techniques in recent years. The flash memory can be categorized into various types including a NAND flash memory and a NOR flash memory. The memory unit array of the NAND flash memory can have higher density and can be applied in mass data storage.

The NAND flash memory includes a plurality of memory units, and a recess exists between adjacent memory units. A semiconductor layer is formed on the bottom surface and the sidewall of the recess as a channel layer for each memory unit. In the process of forming the recess, the depths of all of the recesses are not likely to be precisely equal. The recess having a greater depth causes the channel layer formed thereon to have a greater vertical dimension. As such, the corresponding memory unit has a greater channel length (i.e., higher resistance), which results in reduction of the operation current. Moreover, when the channel of the memory unit is excessively long, an issue of open circuit may occur.

SUMMARY OF THE INVENTION

The invention provides a memory device and a manufacturing method thereof that can ensure operation current and prevent the issue of open circuit.

A memory device of the invention includes a pair of stacked structures, a charge storage layer, and a channel layer. The pair of stacked structures are disposed on a substrate. Each of the stacked structures includes a plurality of gate layers and a plurality of insulating layers alternately stacked on the substrate, and includes a cap layer located on the plurality of gate layers and the plurality of insulating layers. The charge storage layer is disposed on sidewalls of the pair of stacked structures that are facing each other. The channel layer covers the charge storage layer. The channel layer has a top portion, a body portion, and a bottom portion. The top portion covers sidewalls of the cap layers of the pair of stacked structures that are facing each other. The bottom portion covers a portion of the substrate located between the pair of stacked structures. The body portion is connected between the top portion and the bottom portion. Dopant concentrations of the top portion and the bottom portion are respectively greater than a dopant concentration of the body portion.

In some embodiments, the dopant concentrations of the top portion and the bottom portion of the channel layer may respectively range from $10^{17}$ atoms/cm$^3$ to $10^{21}$ atoms/cm$^3$.

In some embodiments, the cap layer includes a top gate layer.

In some embodiments, the top portion of the channel layer further covers a top surface of the cap layer.

In some embodiments, the stacked structures further include a bottom gate layer. The bottom gate layer is located on the substrate, and the plurality of gate layers and the plurality of insulating layers are located on the bottom gate layer.

In some embodiments, the memory device further includes an isolation structure. The isolation structure is disposed on the portion of the substrate located between the pair of stacked structures. The channel layer is located at a sidewall and a bottom surface of the isolation structure.

In some embodiments, the material of the cap layer includes an insulating material.

In some embodiments, the memory device further includes an epitaxial layer. The epitaxial layer is disposed on the portion of the substrate located between the pair of stacked structures. The bottom portion of the channel layer covers the epitaxial layer.

In some embodiments, a dopant concentration of the epitaxial layer is greater than the dopant concentration of the body portion of the channel layer.

In some embodiments, the memory device further includes an isolation structure and an upper pad. The isolation structure and the upper pad are filled on the portion of the substrate located between the pair of stacked structures. The isolation structure is located between the substrate and the upper pad. The top portion of the channel layer is located at a sidewall of the upper pad. The body portion of the channel layer is located at a sidewall of the isolation structure, and the insulation structure covers the bottom portion of the channel layer.

A manufacturing method of a memory device of the invention includes the following steps. A pair of stacked structures is formed on a substrate, wherein each stacked structure includes a plurality of first material layers and a plurality of second material layers alternately stacked on the substrate, and includes a cap layer located on the plurality of first material layers and the plurality of second material layers. A charge storage layer is formed on sidewalls of the pair of stacked structures that are facing each other. A channel layer is formed on the charge storage layer, wherein the channel layer has a top portion, a body portion, and a bottom portion, the top portion covers sidewalls of the cap layers of the pair of stacked structures that are facing each other, the bottom portion covers a portion of the substrate located between the pair of stacked structures, the body portion is connected between the top portion and the bottom portion, and dopant concentrations of the top portion and the bottom portion are respectively higher than a dopant concentration of the body portion.

In some embodiments, the method of forming the channel layer includes the following. A channel material layer and a barrier layer are sequentially foil red on a charge storage layer. The barrier layer is patterned such that the patterned barrier layer exposes a portion of the channel material layer located between the pair of stacked structures and substantially parallel to a main surface of the substrate and exposes another portion of the channel material layer covering the cap layer. A doping layer is formed on the patterned barrier layer and the exposed portions of the channel material layer. A heat treatment is performed such that dopants in the doping layer enters the exposed portions of the channel material layer to form a channel layer. The doping layer and the patterned barrier layer are removed.

In some embodiments, the method of patterning the barrier layer includes an anisotropic etching.

In some embodiments, each of the first material layers is a gate layer, each of the second material layers is an insulating layer, and the cap layer includes a top gate layer.

In some embodiments, each of the stacked structures further includes a bottom gate layer. The bottom gate layer is located on the substrate, and the plurality of first material layers and the plurality of second material layers are formed on the bottom gate layer.

In some embodiments, an isolation structure is further formed between the pair of stacked structures after the channel layer is formed.

In some embodiments, the plurality of first material layers and the plurality of second material layers are both insulating materials and have an etch selectivity to each other.

In some embodiments, an epitaxial layer is further formed before the charge storage layer is formed. The epitaxial layer is disposed on the portion of the substrate located between the pair of stacked structures.

In some embodiments, an isolation structure and an upper pad are further formed between the pair of stacked structures in order after the channel layer is formed. The top portion of the channel layer is located at a sidewall of the upper pad, and the body portion and the bottom portion of the channel layer are respectively located at a sidewall and a bottom surface of the isolation structure.

In some embodiments, the plurality of second material layers is further replaced by a plurality of gate layers after the channel layer is formed.

Based on the above, the channel layer of the memory device has a top portion and a bottom portion having high dopant concentrations, and has a body portion having a dopant concentration significantly less than those of the top portion and the bottom portion. Since the top portion and the bottom portion of the channel layer are doped to have high dopant concentrations, the overall resistance of the channel layer can be effectively reduced. As a result, even if the depth of the recess between certain stacked structures is too large, the operation current of the channel layer can still be maintained. Moreover, in some embodiments, the issue of open circuit to the channel layer corresponding to those certain stacked structures can be further prevented. Moreover, since the top portion of the channel layer has a high dopant concentration (i.e., low resistance), the contact resistance between the channel layer and the conductive plug subsequently formed thereon can be reduced. On the other hand, during doping the top portion and the bottom portion of the channel layer, the remaining portion of the barrier layer (i.e., the body portion of the barrier layer) can prevent the dopant from diffusing and driving into the body portion of the channel layer, such that the body portion of the channel layer covering the sidewalls of the memory units maintains a relatively low dopant concentration. Accordingly, during operation of the memory device, the occurrence of the dopants inside the body portion of the channel layer diffusing toward the memory units can be reduced. As a result, a reliability of the memory device can be ensured.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
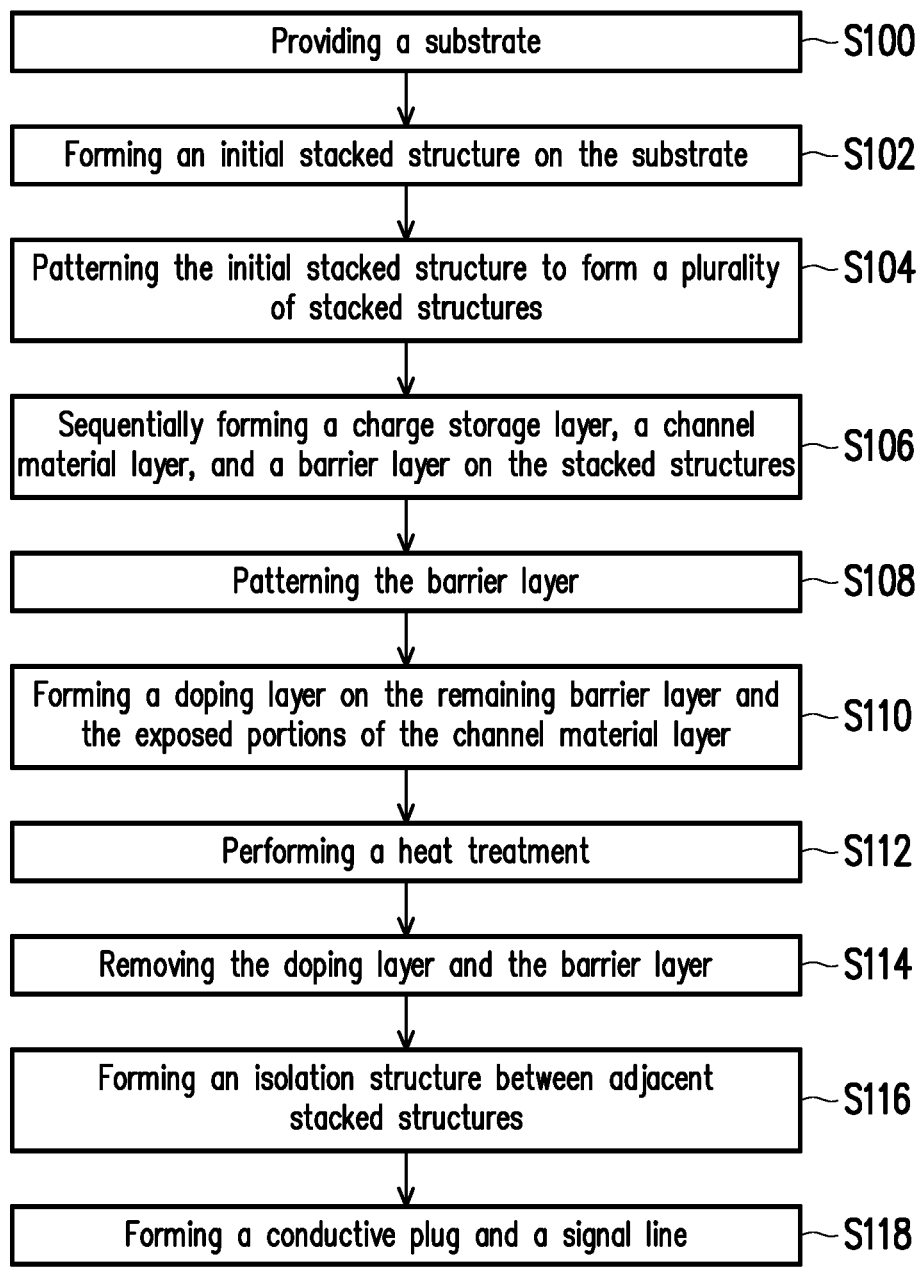
FIG. 1 is a flow chart of a manufacturing method of a memory device according to some embodiments of the invention.

FIG. 1 is a flow chart of a manufacturing method of a memory device 10 according to some embodiments of the invention. FIG. 2A to FIG. 2H are cross-sectional views of structures at each stage in the manufacturing method of the memory device 10 as shown in FIG. 1.

Figure 2A:
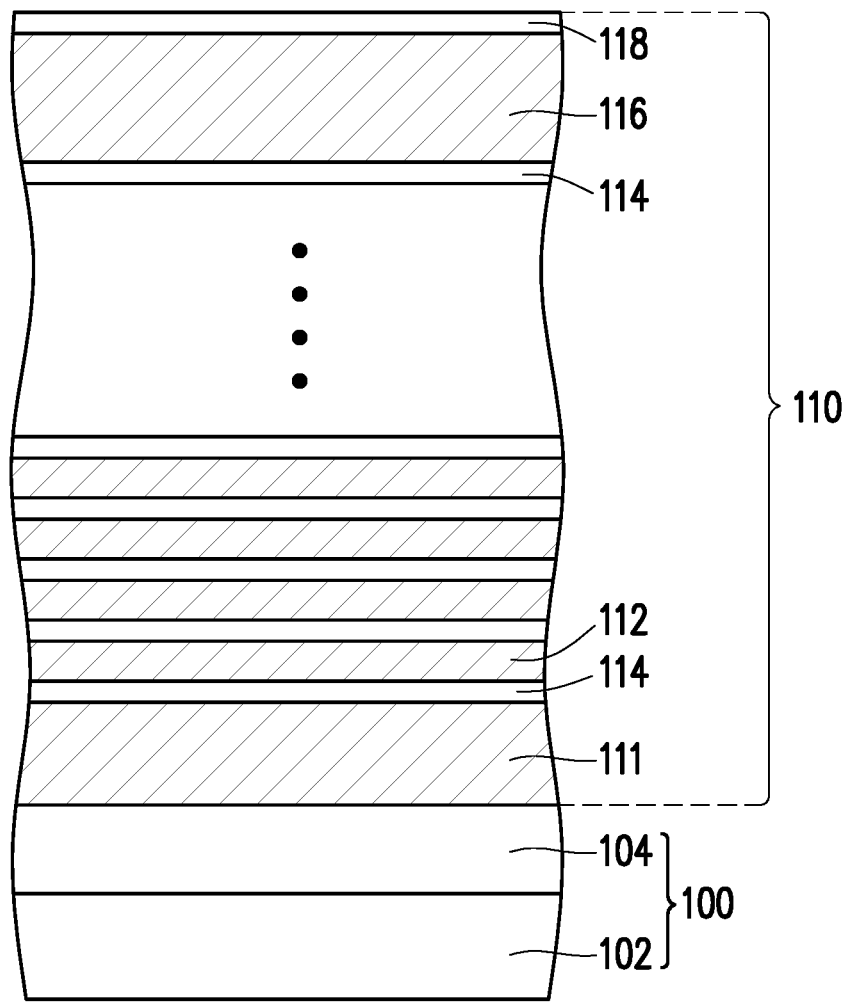
FIG. 2A to FIG. 2H are cross-sectional views of structures at each stage in the manufacturing method of the memory device as shown in FIG. 1.

Referring to FIG. 1 and FIG. 2A, step S100 is performed to provide a substrate 100. In some embodiments, the substrate 100 includes a semiconductor substrate 102 and an insulating layer 104. The material of the semiconductor substrate 102 may include an elemental semiconductor or a compound semiconductor. For instance, the elemental semiconductor may include Si or Ge. The compound semiconductor may include SiGe, SiC, SiGeC, a Group III-V semiconductor material, or a Group II-VI semiconductor material. The Group III-V semiconductor material may include GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The Group II-VI semiconductor material can include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. Moreover, the semiconductor substrate 102 may be doped into a first conductivity type or a second conductivity type complementary to the first conductivity type. For instance, the first conductivity type may be N-type, and the second conductivity type may be P-type. Moreover, a material of the insulating layer 104 may be silicon oxide, silicon nitride, silicon oxynitride, or a combination thereof.

Step S102 is performed to form an initial stacked structure 110 on the substrate 100. The initial stacked structure 110 includes a plurality of first material layers 112 and second material layers 114 alternately stacked. Those having ordinary skill in the art can adjust the quantity of the first material layers 112 and the second material layers 114 according to design requirement, and the invention is not limited thereto. In some embodiments, the first material layers 112 are conductive layers, and the second material layers 114 are insulating layers. In these embodiments, the first material layers 112 may be functioned as gate layers (or word lines), and the second material layers 114 may be functioned as inter-gate insulating layers. For instance, a material of the first material layers 112 may include polysilicon, tungsten, or other conductive materials. A material of the second material layers 114 may include silicon oxide, silicon nitride, silicon oxynitride, an organic insulating material, or the like. In some embodiments, a thickness of the first material layers 112 ranges from 10 nm to 40 nm. Moreover, a thickness of the second material layers 114 may range from 25 nm to 65 nm. Moreover, the initial stacked structure 110 further includes a cap layer 116 located on the first material layers 112 and the second material layers 114. In some embodiments, the topmost second material layer 114 may be located between the cap layer 116 and the topmost first material layer 112. In some embodiments, the cap layer 116 and the first material layers 112 are formed by the same material, except that the cap layer 116 has a greater thickness. For instance, a thickness of the cap layer 116 may range from 50 nm to 250 nm. In these embodiments, the cap layer 116 may be functioned as a top gate layer or a selection gate layer.

In some embodiments, the initial stacked structure 110 further includes a protective layer 118. The protective layer 118 is located on the cap layer 116. Moreover, the protective layer 118 and the second material layer 114 may be formed by the same material, and may have substantially the same thickness. In some embodiments, the initial stacked structure 110 further includes a bottom gate layer 111. The bottom gate layer 111 is located on the substrate 100, and the first material layers 112 and the second material layers 114 are located on the bottom gate layer 111. In some embodiments, the bottommost second material layer 114 may be located between the bottom gate layer 111 and the bottommost first material layer 112. Moreover, in some embodiments, the bottom gate layer 111 and the first material layers 112 are formed by the same material, except that the bottom gate layer 111 has a greater thickness. For instance, a thickness of the bottom gate layer 111 may range from 150 nm to 350 nm. In these embodiments, the bottom gate layer 111 may be functioned as an inversion gate layer. In some embodiments, each layer of the initial stacked structure 110 may be formed via a chemical vapor deposition method.

Figure 2B:
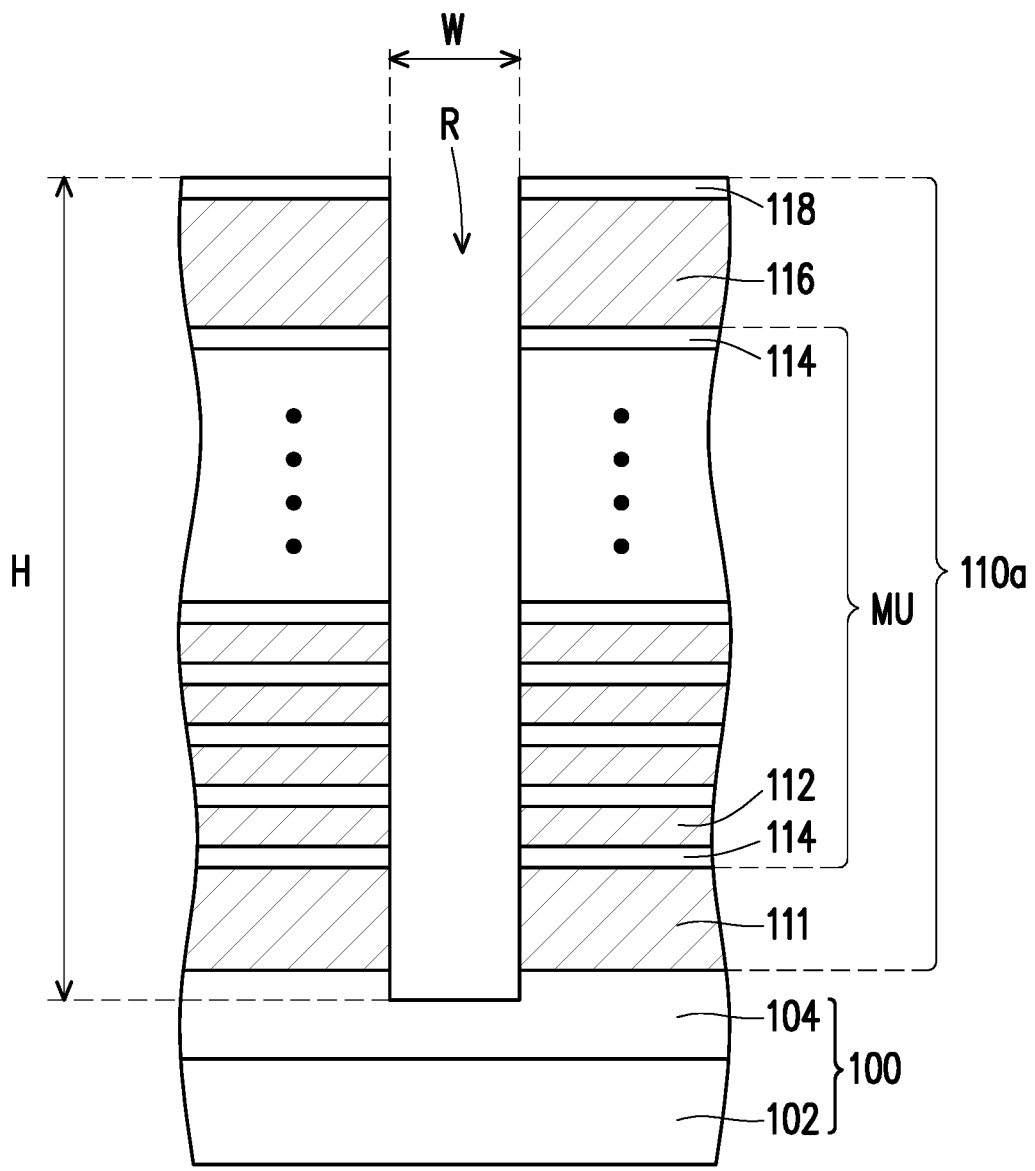

Referring to FIG. 1 and FIG. 2B, step S104 is performed to pattern the initial stacked structure 110. As a result, a plurality of stacked structures 110a are formed. In some embodiments, the stacked structures 110a may be arranged in an array on the substrate 100. The first material layers 112 and the second material layers 114 alternately stacked in each of the stacked structures 110a may be functioned as a memory unit MU. The memory unit MU is located between the bottom gate layer 111 and the cap layer 116. A recess R is located between a pair of the stacked structures 110a. In some embodiments, the recess R may be extended into the insulating layer 104 of the substrate 100. In some embodiments, a height H of the recess R may range from 1.5 μm to 3.5 μm. A width W of the recess R (i.e., a spacing between a pair of the stacked structures 110a) may range from 50 nm to 150 nm. In some embodiments, a method of patterning the initial stacked structure 110 to form the stacked structures 110a may include performing a lithography process and an etching process. A sidewall of the recess R (i.e., a sidewall of the stacked structure 110a) may be substantially perpendicular to the main surface of the substrate 100, or may be tilted from a normal direction of the main surface of the substrate 100 by an angle from 0° to 30°.

Figure 2C:
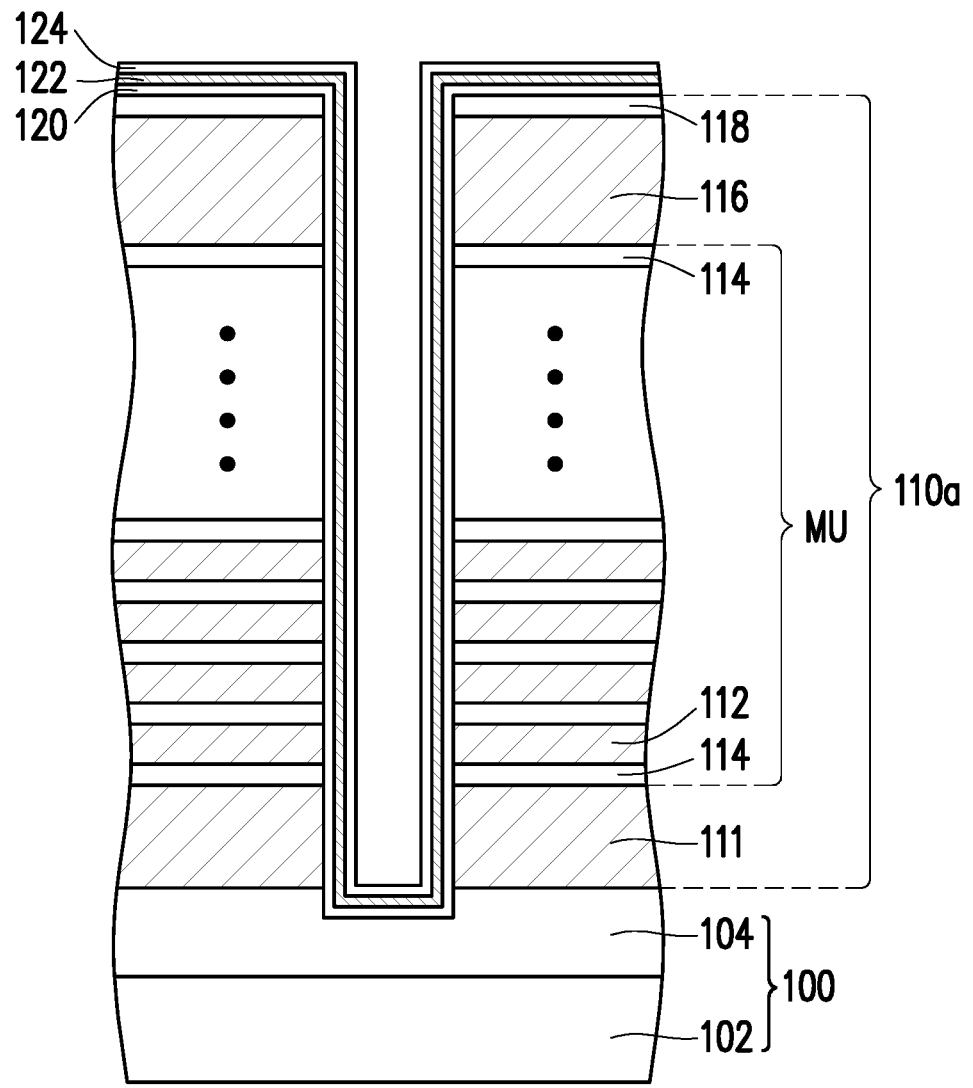

Referring to FIG. 1 and FIG. 2C, step S106 is performed to sequentially form a charge storage layer 120, a channel material layer 122, and a barrier layer 124 on the stacked structures 110a. In other words, the channel material layer 122 is located between the charge storage layer 120 and the barrier layer 124. In some embodiments, the charge storage layer 120, the channel material layer 122, and the barrier layer 124 may be conformally formed on the structure shown in FIG. 2B. As a result, as shown in FIG. 2C, the charge storage layer 120, the channel material layer 122, and the barrier layer 124 cover the sidewalls of adjacent stacked structures 110a that are facing each other, and cover the top surfaces of the stacked structures 110a and a portion of the substrate 100 located between adjacent stacked structures 110a. In some embodiments, a material of the charge storage layer 120 includes silicon oxide, silicon nitride, or a combination thereof. For instance, the charge storage layer 120 includes a multilayer structure including silicon oxide/silicon nitride/silicon oxide. A material of the channel material layer 122 includes an undoped intrinsic semiconductor material, such as polysilicon or other suitable semiconductor materials. A material of the barrier layer 124 may include silicon nitride. In some embodiments, a thickness of the charge storage layer 120 may range from 15 nm to 25 nm. A thickness of the channel material layer 122 may range from 5 nm to 15 nm. A thickness of the barrier layer 124 may range from 5 nm to 20 nm. Moreover, the charge storage layer 120, the channel material layer 122 and the barrier layer 124 may be formed by, for instance, a furnace growth method.

Figure 2D:
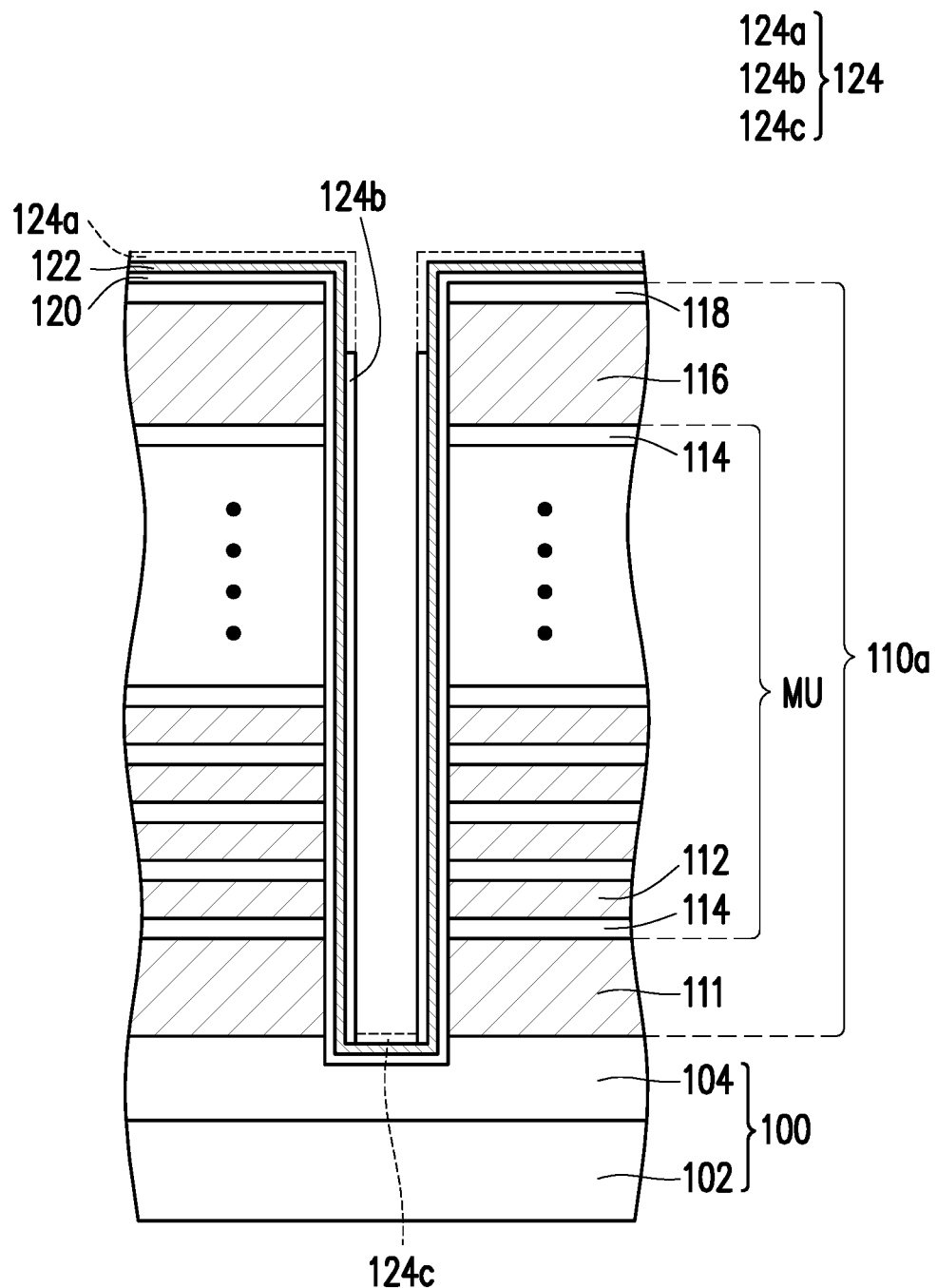

Referring to FIG. 1 and FIG. 2D, step S108 is performed to pattern the barrier layer 124. In some embodiments, a method of patterning the barrier layer 124 includes performing an anisotropic etching, such as dry etching. In the anisotropic etching process, due to the difference of arrival angles corresponding to each portion of the barrier layer 124, some portions of the barrier layer 124 are removed, and some other portions of the barrier layer 124 are kept. Specifically, a top portion 124a and a bottom portion 124c of the barrier layer 124 can be removed in step S108, and a body portion 124b of the barrier layer 124 can be kept. In some embodiments, the top portion 124a of the barrier layer 124 covered the top surfaces of the stacked structures 110a (such as the top surface of the protective layer 118) before removal, and was extended onto the sidewalls of the protective layer 118 and the cap layer 116. The bottom portion 124c of the barrier layer 124 covered a portion of the substrate 100 located between adjacent stacked structures 110a before removal, and in some embodiments might be extended onto the sidewall of the bottom gate layer 111. The body portion 124b of the barrier layer 124 was connected between the top portion 124a and the bottom portion 124b before removal. In other words, the body portion 124b of the barrier layer 124 covers the sidewall of the memory units MU, and may be extended onto the sidewalls of the bottom gate layer 111 and the cap layer 116. After the barrier layer 124a is patterned, only the body portion 124b of the barrier layer 124 is left to form a plurality of longitudinal line segments covering the memory units MU. As a result, a portion of the channel material layer 122 covering the top surfaces of the stacked structures 110a (such as covering the top surface of the protective layer 118) is exposed, and another portion of the channel material layer 122 covering a portion of the substrate 100 located between adjacent stacked structures 110a and substantially parallel to the main surface of the substrate 100 is exposed as well. Moreover, it can be appreciated from the above that, the portion of the channel material layer 122 to be exposed in step S108 was once overlapped with the top portion 124a and the bottom portion 124c of the barrier layer 124 before step S108.

Figure 2E:
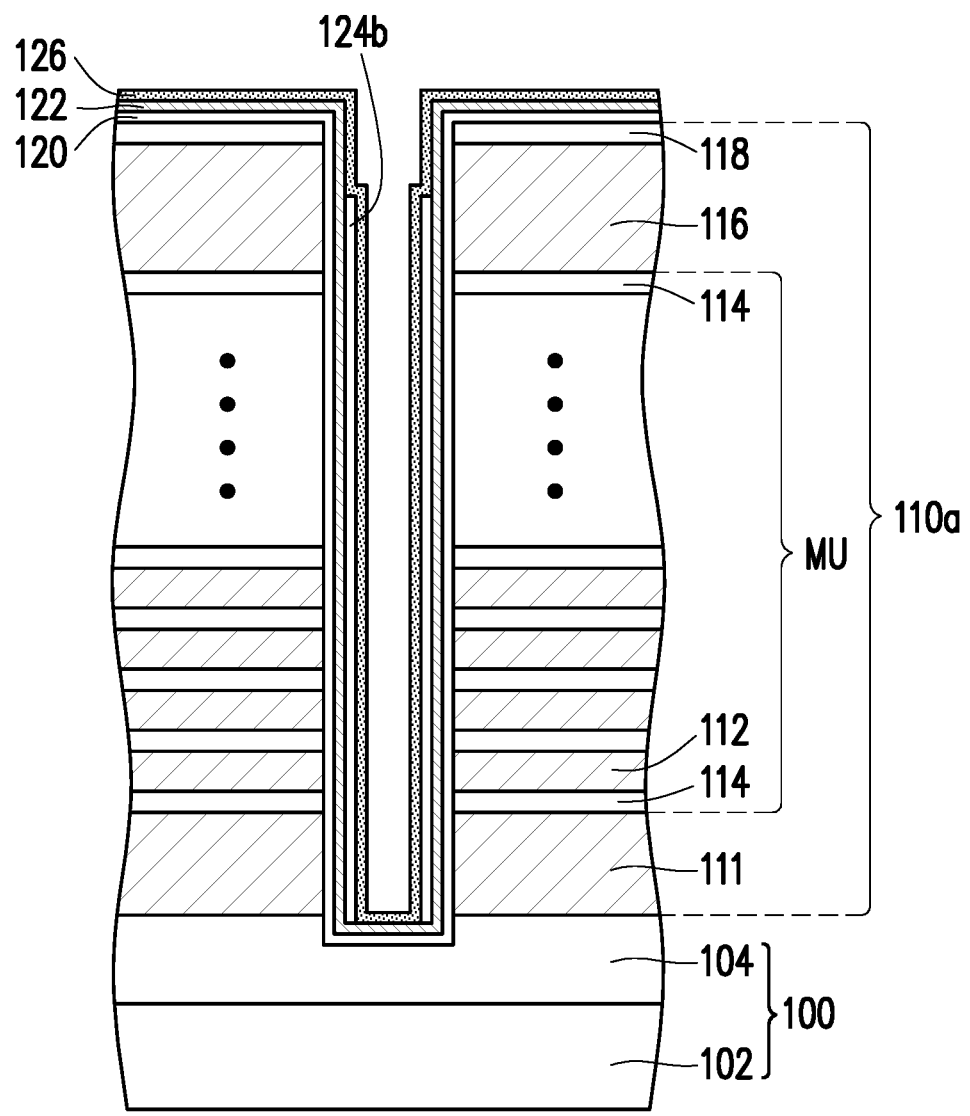

Referring to FIG. 1 and FIG. 2E, step S110 is performed to form a doping layer 126 on the body portion 124b of the barrier layer 124 and the exposed portions of the channel material layer 122. The doping layer 126 may be conformally framed on the structure shown in FIG. 2D and be in contact with the body portion 124b of the barrier layer 124 and the exposed portions of the channel material layer 122. In some embodiments, the doping layer 126 may have dopants with the first conductivity type or the second conductivity type. For instance, a material of the doping layer 126 may include phospho-silicate glass (PSG), tetra-ethyl orthosilicate (TEOS), boron-silicate glass (BSG), tri-ethylborate (TEB), triethylphosphate (TEPO), or a combination thereof. Moreover, the doping layer 126 may be formed via, for instance, a chemical vapor deposition method or a furnace growth method.

Figure 2F:
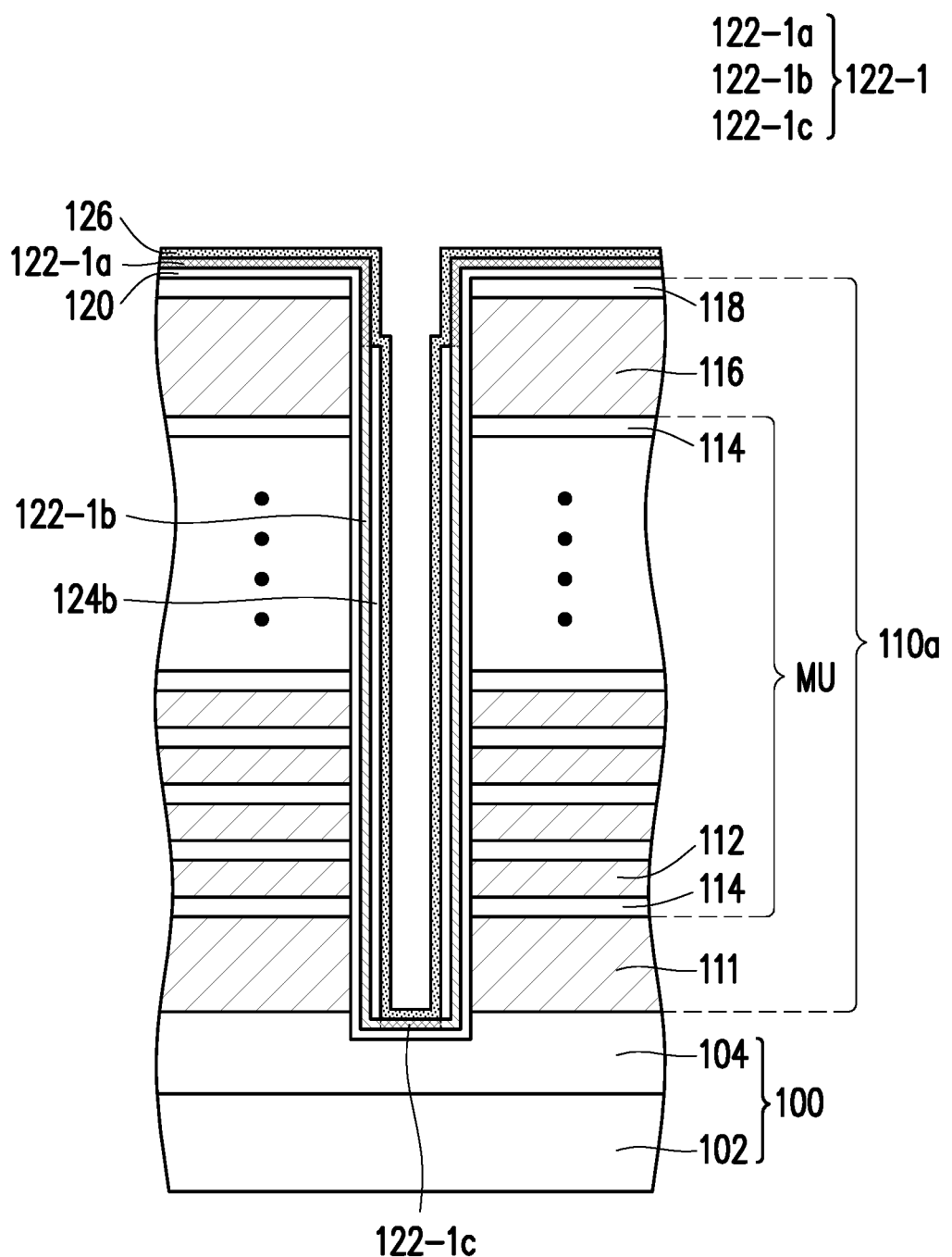

Referring to FIG. 1 and FIG. 2F, step S112 is performed to perform a heat treatment. As a result, the dopants in the doping layer 126 can be diffused and driven into the exposed portions of the channel material layer 122, so as to dope the exposed portions of the channel material layer 122. In some embodiments, a method of performing the heat treatment may include an annealing process. A temperature range of the heat treatment may be from 600° C. to 1000° C., and the heat treatment may be performed in an inert gas (such as nitrogen) atmosphere. The doped channel material layer 122 can be indicated as a channel layer 122-1. A top portion 122-1a and a bottom portion 122-1c of the channel layer 122-1 are doped in step S112. On the other hand, the body portion 124b of the barrier layer 124 covers a body portion 122-1b of the channel layer 122-1, so as to block the dopants from diffusing and driving into the body portion 122-1b of the channel layer 122-1. Therefore, the body portion 122-1b of the channel layer 122-1 are not doped in step S112.

Locations of the top portion 122-1a, the bottom portion 122-1c, and the body portion 122-1b of the channel layer 122-1 shown in FIG. 2F would be respectively overlapped with the locations of the top portion 124a, the bottom portion 124c, and the body portion 124b of the barrier layer 124 shown in FIG. 2D. In other words, the top portion 122-1a of the channel layer 122-1 covers the top surfaces of the stacked structures 110a, and is extended onto the sidewalls of the protective layer 118 and the cap layer 116. The bottom portion 122-1c of the channel layer 122-1 covers a portion of the substrate 100 located between adjacent stacked structures 110a, and in some embodiments may be extended onto the sidewall of the bottom gate layer 111. The body portion 122-1b of the channel layer 122-1 is connected between the top portion 122-1a and the bottom portion 122-1c and covers the sidewalls of the memory units MU, and may be longitudinally extended onto the sidewalls of the bottom gate layer 111 and the cap layer 116.

Since the top portion 122-1a and the bottom portion 122-1c of the channel layer 122-1 are further doped in step S112, the dopant concentrations of the top portion 122-1a and the bottom portion 122-1c of the channel layer 122-1 can be respectively higher than the dopant concentration of the body portion 122-1b. In some embodiments, the dopant concentrations of the top portion 122-1a and the bottom portion 122-1c of the channel layer 122-1 can respectively range from $10^{17}$ atoms/cm$^3$ to $10^{21}$ atoms/cm$^3$. On the other hand, the body portion 122-1b of the channel layer 122-1 is remained undoped.

Figure 2G:
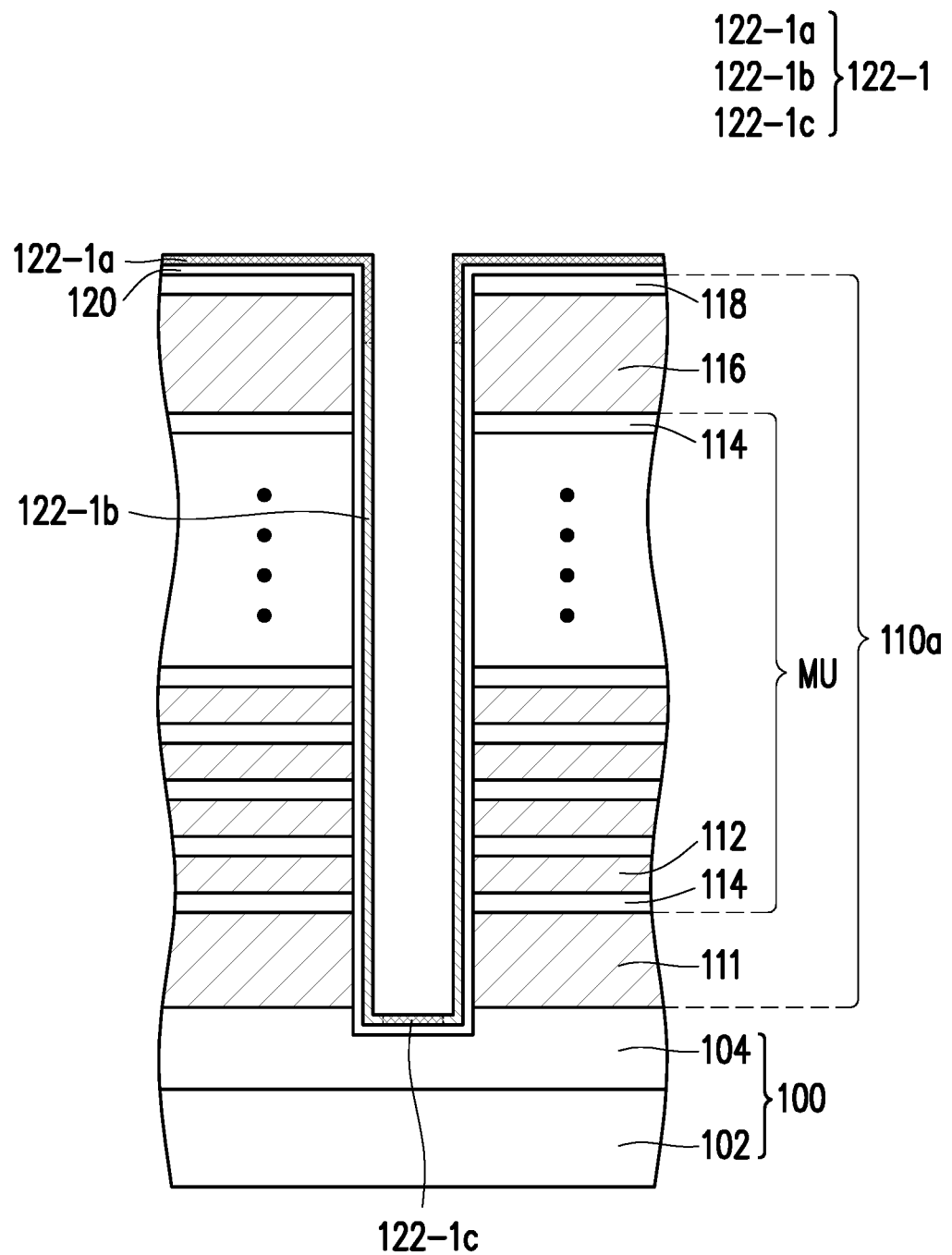

Referring to FIG. 1 and FIG. 2G, step S114 is performed to remove the doping layer 126 and the body portion 124b of the barrier layer 124. As a result, each portion of the channel layer 122-1 can be exposed. In some embodiments, a method of removing the doping layer 126 and the body portion 124b of the barrier layer 124 may include an anisotropic etching, such as wet etching.

Figure 2H:
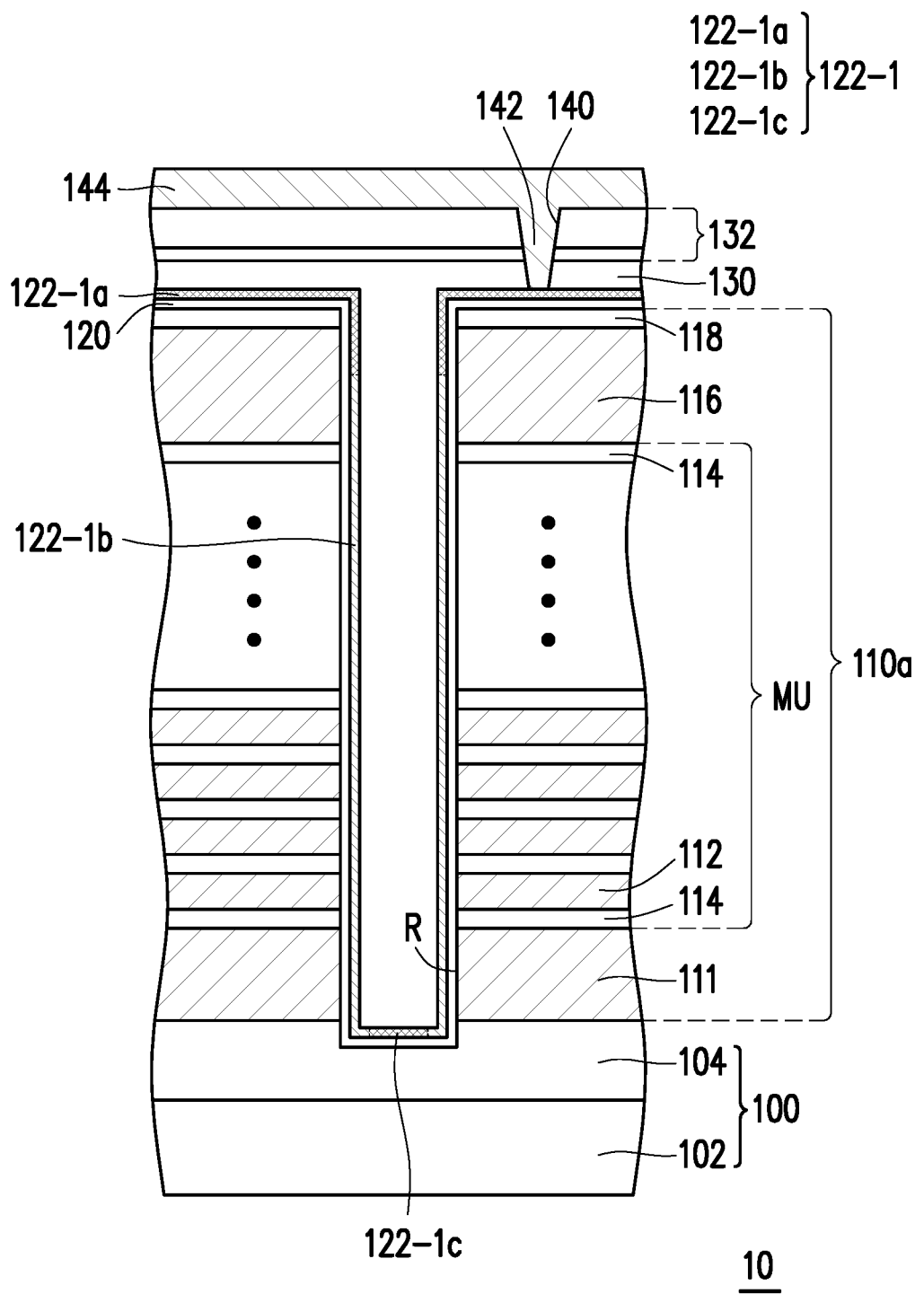

Referring to FIG. 1 and FIG. 2H, in some embodiments, step S116 may be performed to form an isolation structure 130 between adjacent stacked structures 110a. In some embodiments, the isolation structure 130 may be further extended onto the top surfaces of the stacked structures 110a. A material of the isolation structure 130 may include silicon oxide, silicon nitride, silicon oxynitride, or a combination thereof. A method of forming the isolation structure 130 may include a chemical vapor deposition method.

Next, step S118 may be performed to form a conductive plug 142 and a signal line 144. Before the conductive plug 142 and the signal line 144 are formed, a dielectric layer 132 may be formed on the isolation structure 130. For instance, the dielectric layer 132 may be a multilayer structure including one or a plurality of dielectric material layers. A material of the dielectric layer 132 may include silicon oxide, silicon nitride, silicon oxynitride, or a combination thereof. A method of forming the dielectric layer 132 may include a chemical vapor deposition method. Moreover, the isolation structure 130 and the dielectric layer 132 may be patterned to form a plug opening 140 exposing the top portion 122-1a of the channel layer 122-1. Next, the conductive plug 142 may be formed in the plug opening 140, and a signal line 144 may be formed on the dielectric layer 132. In some embodiments, a material of the conductive plug 142 may include polysilicon or other conductive materials. A material of the signal line 144 may include copper or other conductive materials. A method of forming the conductive plug 142 and the signal line 144 may include a physical vapor deposition method, a plating process, or a combination thereof. Although FIG. 2H only shows a single layer of the signal line 144, the signal line 144 may actually include a source line and a bit line located at different layers. Moreover, an interlayer dielectric layer (not shown) may be formed between the source line and the bit line. In some embodiments, the stacked structures 110a arranged along a direction parallel to the surface of the substrate 100 may be alternately coupled to the source line and the bit line via the top portion 122-1a of the channel layer 122-1. In some embodiments, an extending direction of at least one of the word line (such as the first material layers 112), the bit line, and the source line may be different from or perpendicular to extending directions of the other two.

At this point, the manufacture of the memory device 10 of embodiments of the invention is complete. Based on the above, the channel layer 122-1 of the memory device 10 has a top portion 122-1a and a bottom portion 122-1c having high dopant concentrations, and has a body portion 112-1b having a dopant concentration significantly less than those of the top portion 122-1a and the bottom portion 122-1c. Since the top portion 122-1a and the bottom portion 122-1c of the channel layer 122-1 have high dopant concentrations, the overall resistance of the channel layer 122-1 can be effectively reduced. As a result, even if the depth of the recess R between certain stacked structures 110a is too large, the operation current of the channel layer 122-1 can still be maintained. Furthermore, in some embodiments, the issue of open circuit to the channel layer 122-1 corresponding to those certain stacked structures 110a can be prevented. Moreover, since the top portion 122-1a of the channel layer 122-1 has a high dopant concentration (i.e., low resistance), a contact resistance between the channel layer 122-1 and the conductive plug 142 subsequently formed thereon can be reduced. On the other hand, during doping the top portion 122-1a and the bottom portion 122-1c of the channel layer 122-, the remaining portion of the barrier layer 124 (i.e., the body portion 124b of the barrier layer 124) can prevent the dopants from diffusing and driving into the body portion 122-1b of the channel layer 122-1, such that the body portion 122-1b of the channel layer 122-1 maintains a relatively low dopant concentration. Accordingly, during operation of the memory device 10, the occurrence of the dopants inside the body portion 122-1b of the channel layer 122-1 diffusing toward the memory units MU can be reduced. As a result, a reliability of the memory device 10 can be ensured.

Figure 3:
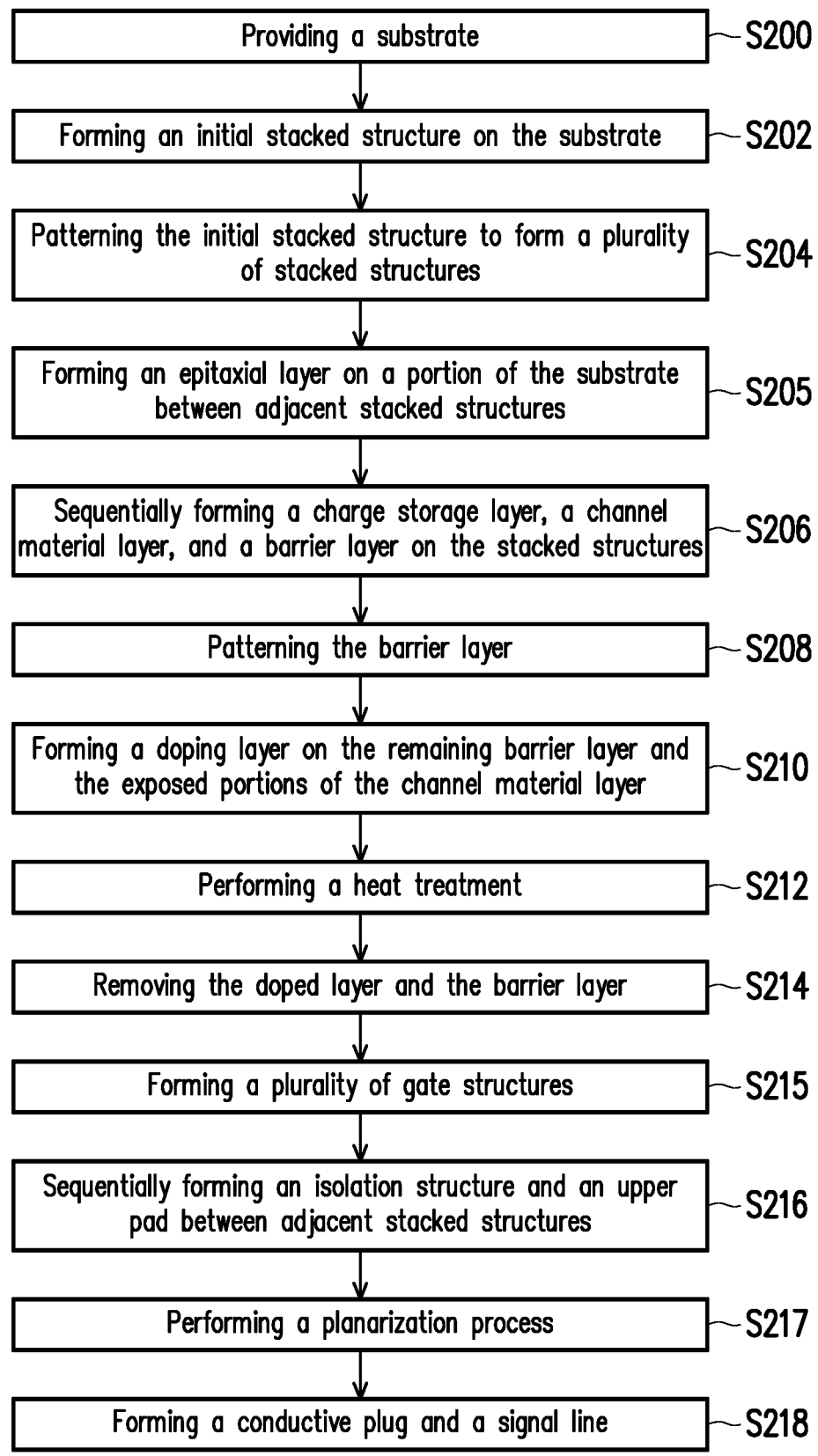
FIG. 3 is a flow chart of a manufacturing method of a memory device according to some embodiments of the invention.

FIG. 3 is a flow chart of a manufacturing method of a memory device 20 according to some embodiments of the invention. FIG. 4A to FIG. 4I are cross-sectional views of structures at each stage in the manufacturing method of the memory device 20 as shown in FIG. 3. The manufacturing method of the memory device 20 is similar to the manufacturing method of the memory device 10 as shown in FIG. 1 and FIG. 2A to FIG. 2H, and only the difference therebetween will be described below, and the same or similar portions are not repeated. Moreover, the same or similar reference numerals represent the same or similar components.

Figure 4A:
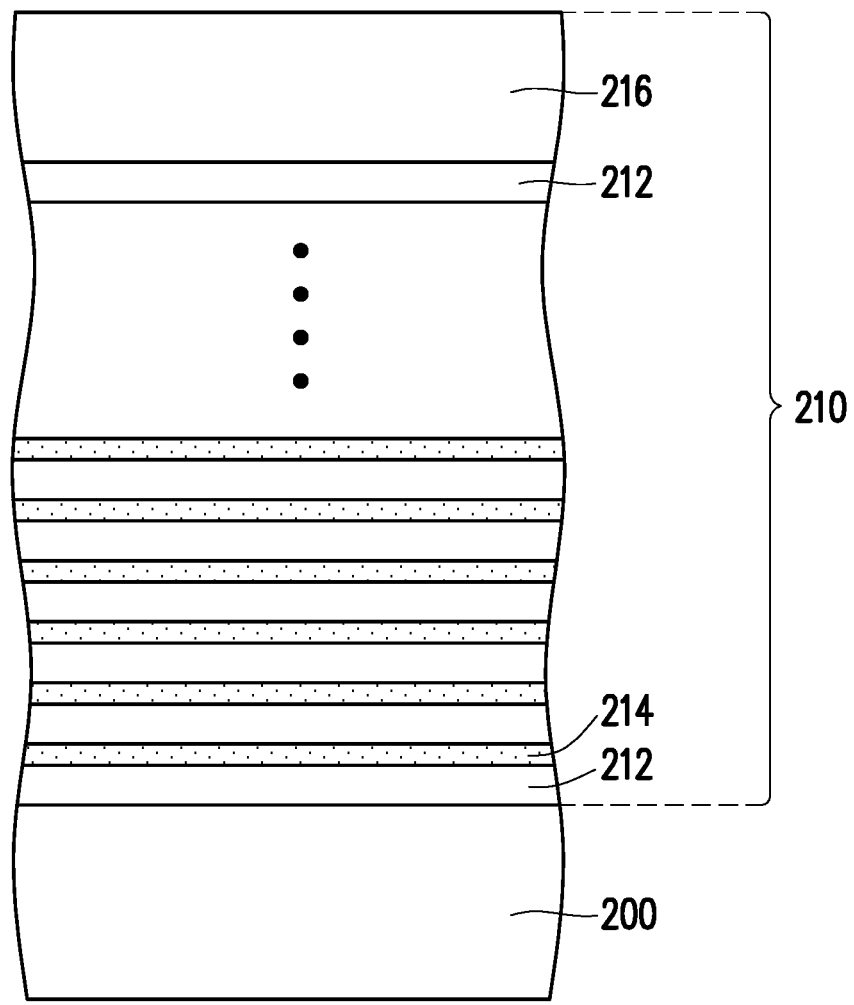
FIG. 4A to FIG. 4I are cross-sectional views of structures at each stage in the manufacturing method of the memory device as shown in FIG. 3.

Referring to FIG. 3 and FIG. 4A, step S200 is performed to provide a substrate 200. In some embodiments, the substrate 200 may be a semiconductor substrate or a semiconductor-on-insulator (SOI) substrate. A material of the semiconductor material in the substrate 200 and the semiconductor substrate 102 shown in FIG. 2A are the same or different. In some embodiments, one or more doped regions (not shown) may be further formed in the substrate 200. Moreover, the conductivity type of the doped regions may be the same as or different from the conductivity type of the substrate 200.

Step S202 is performed to form an initial stacked structure 210 on the substrate 200. The initial stacked structure 210 includes a plurality of first material layers 212 and second material layers 214 alternately stacked. In some embodiments, the first material layers 212 and the second material layers 214 are both insulating materials and have an etch selectivity to each other. For instance, the first material layers 212 may be silicon oxide, and the second material layers 214 may be silicon nitride. In some embodiments, the initial stacked structure 210 may further include a cap layer 216 located on the first material layers 212 and the second material layers 214. In some embodiments, the topmost first material layer 212 may be located between the cap layer 216 and the topmost second material layer 214. In some embodiments, a material of the cap layer 216 may include an insulating material such as the same material as the first material layer 212. Moreover, in these embodiments, the initial stacked structure 210 may not include the protective layer 118 and the bottom gate layer 111 as shown in FIG. 2A.

Figure 4B:
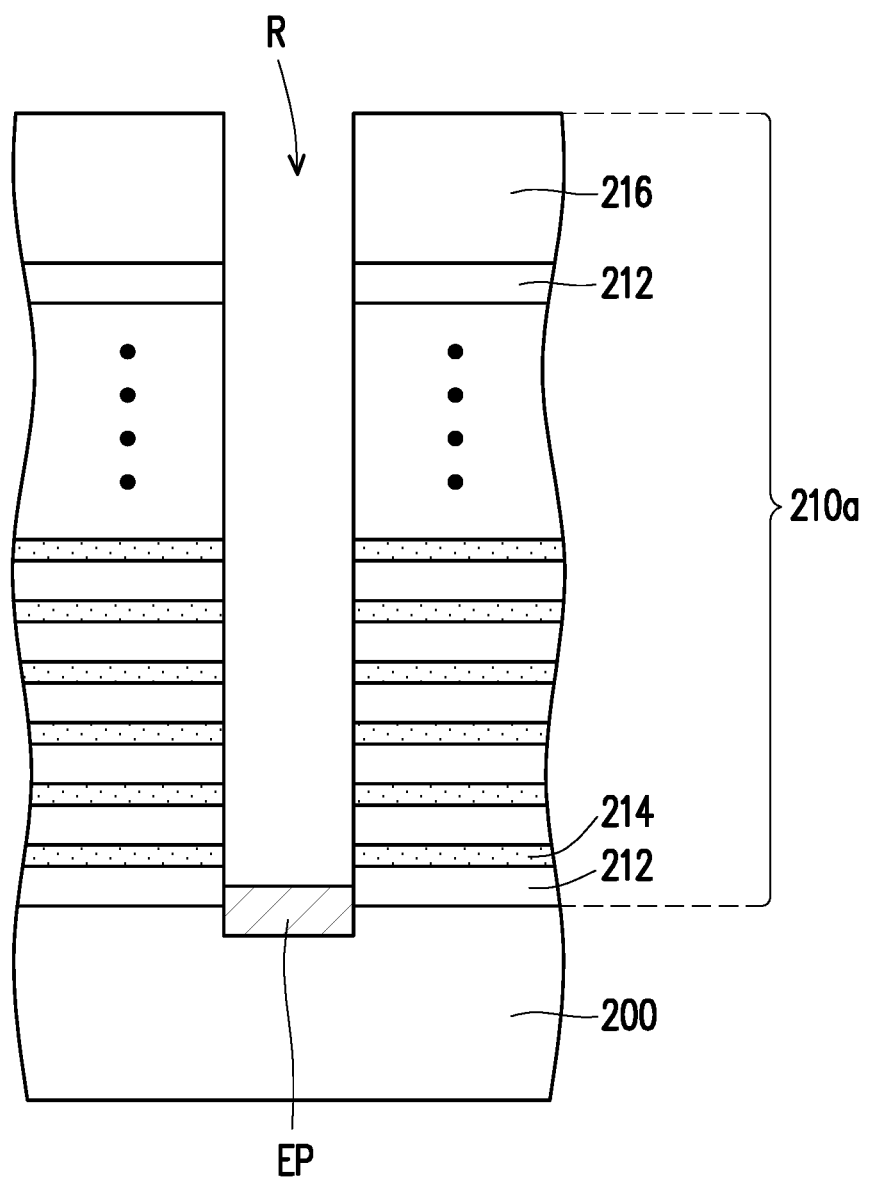

Referring to FIG. 3 and FIG. 4B, step S204 is performed to pattern the initial stacked structure 210. As a result, a plurality of stacked structures 210a are formed. The stacked structures 210a may be arranged in an array on the substrate 200. A recess R is located between adjacent stacked structures 210a.

In some embodiments, after the initial stacked structure 210 is patterned, step S205 may be further perforated to form an epitaxial layer EP on a portion of the substrate 200 exposed by the recess R. In other words, the epitaxial layer EP is disposed on a portion of the substrate 200 located between adjacent a pair of stacked structures 210a. In some embodiments, the epitaxial layer EP is further extended upward to cover a sidewall of the bottommost first material layer 212. For instance, a material of the epitaxial layer EP includes silicon. A method of forming the epitaxial layer EP can include an epitaxy process.

Figure 4C:
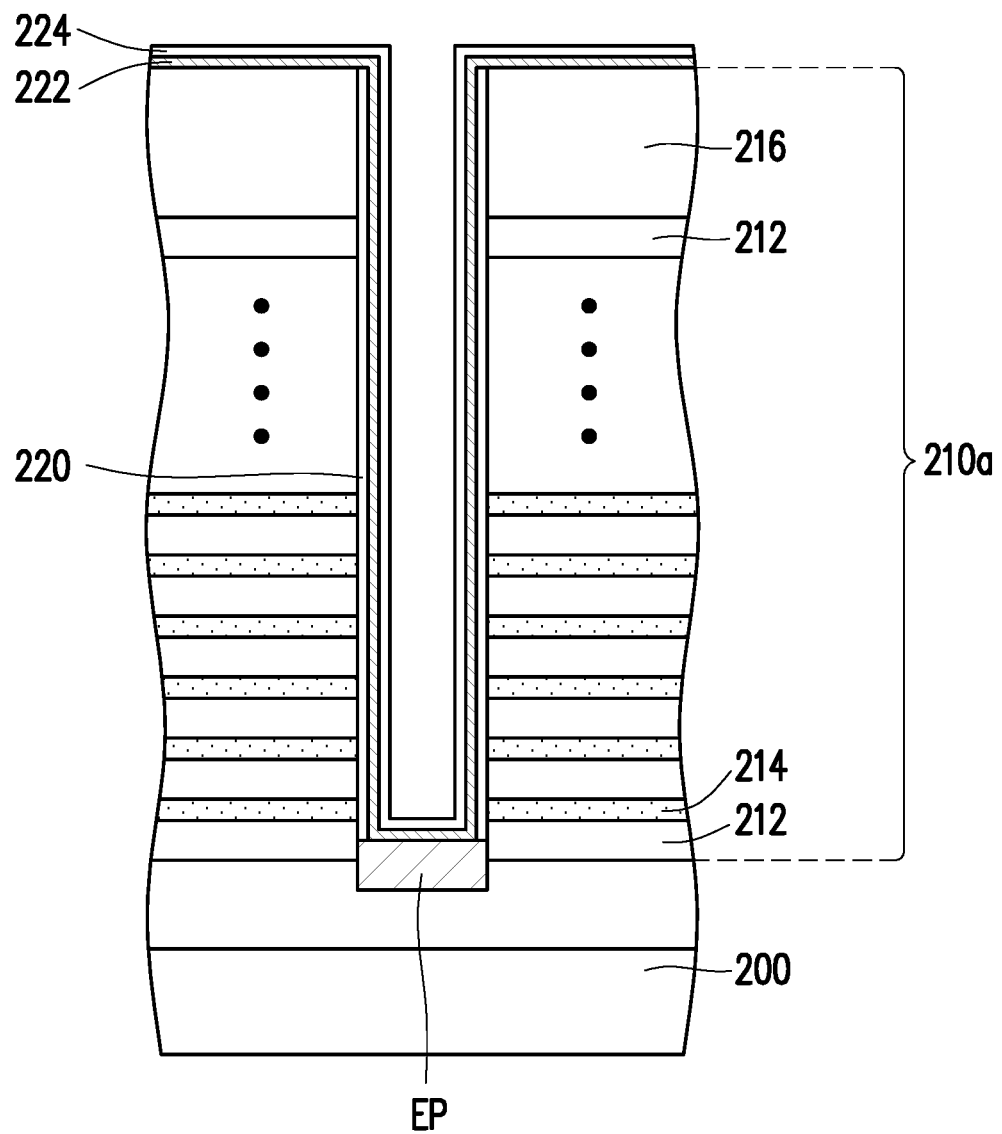

Referring to FIG. 3 and FIG. 4C, step S206 is performed to sequentially form a charge storage layer 220, a channel material layer 222, and a barrier layer 224 on the stacked structures 210a. In some embodiments, the charge storage layer 220 is formed to cover sidewalls of the stacked structures 210a, but is not extended to the top surfaces of the stacked structure 210a. Moreover, in some embodiments, the charge storage layer 220 only covers a portion of a top surface of the epitaxial layer EP. As a result, the charge storage layers located at two opposite sides of the epitaxial layer EP are not connected to each other. In some embodiments, the channel material layer 222 and the barrier layer 224 may be conformally formed on the current structure in order. In other words, as shown in FIG. 4C, the channel material layer 222 and the barrier layer 224 cover a surface of the charge storage layer 220, and cover the top surfaces of the stacked structures 210a and the top surface of the epitaxial layer EP.

Figure 4D:
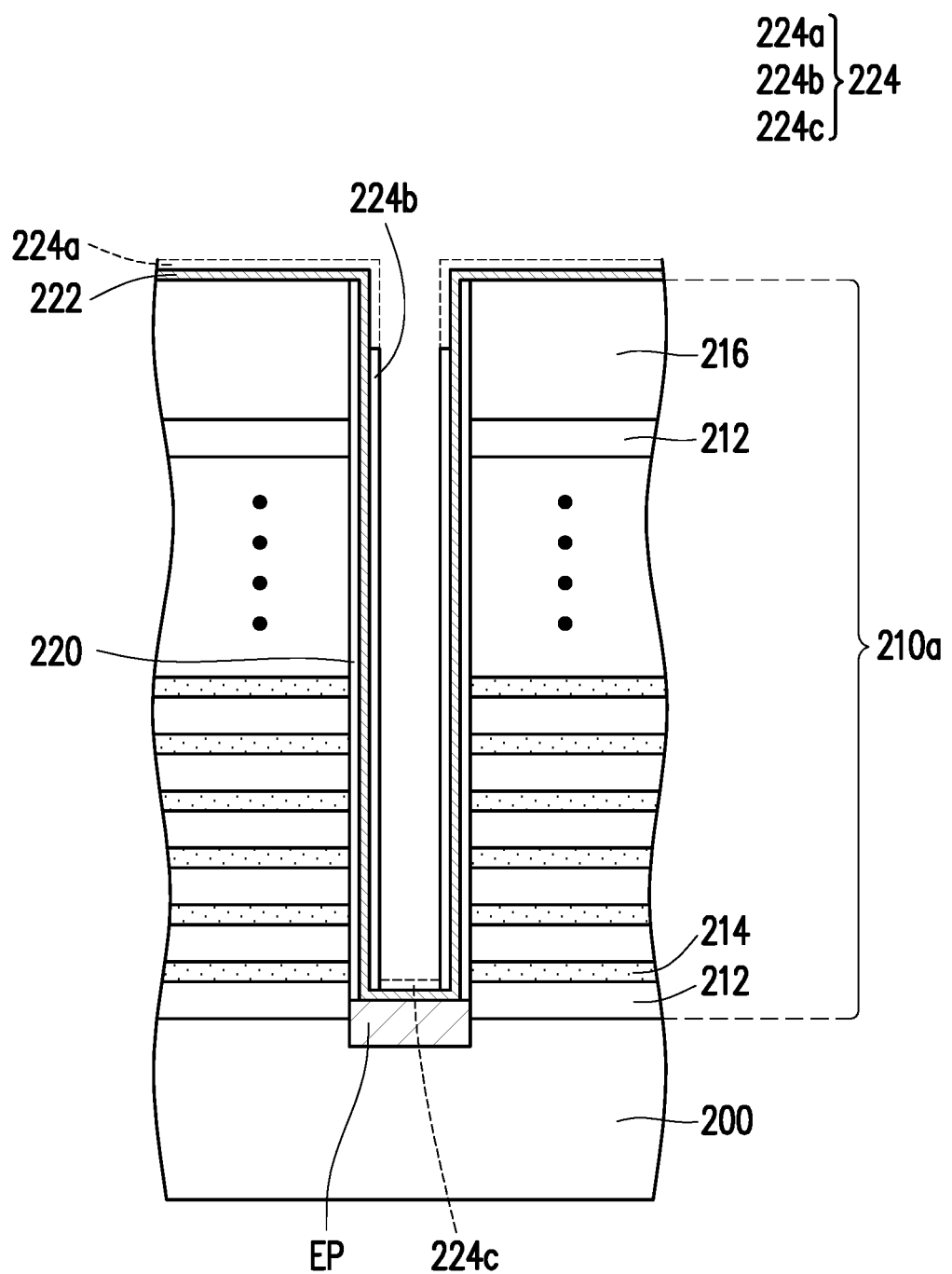

Referring to FIG. 3 and FIG. 4D, step S208 is performed to pattern the barrier layer 224. The top portion 224a and the bottom portion 224c of the barrier layer 224 can be removed in step S208, and the body portion 224b of the barrier layer 224 can be kept. The top portion 224a of the barrier layer 224 covered the top surfaces of the stacked structures 210a (such as the top surfaces of the cap layers 216) before removal and was extended onto a sidewall of the cap layer 216. The bottom portion 224c of the barrier layer 224 covered the top surface of the epitaxial layer EP before removal, and in soiree embodiments, could be extended upward onto the sidewalls of the bottommost first material layers 212 (or extended onto the sidewalls of the bottommost first material layer 212 and the bottommost second material layers 214). The body portion 224b of the barrier layer 224 was connected between the top portion 224a and the bottom portion 224b. After the barrier layer 224 is patterned, only the body portion 224b of the barrier layer 224 is remained. As a result, a portion of the channel material layer 222 covering the top surfaces of the stacked structures 210a (such as covering the top surfaces of the cap layers 216) is exposed, and another portion of the channel material layer 222 covering the epitaxial layer EP is exposed as well. Moreover, it can be known from the above that, the portion of the channel material layer 222 to be exposed in step S208 was overlapped with the top portion 224a and the bottom portion 224c of the barrier layer 224.

Figure 4E:
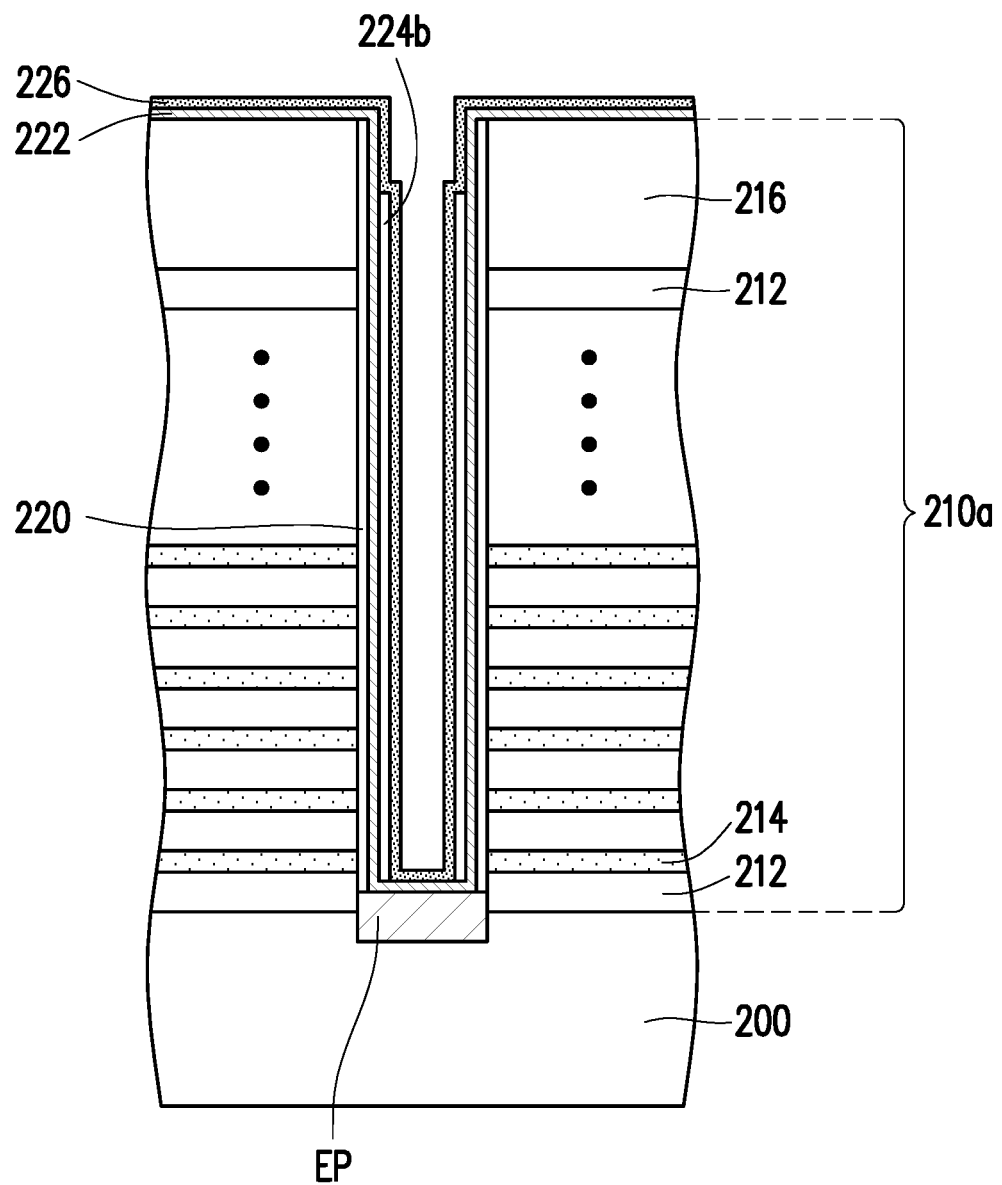

Referring to FIG. 3 and FIG. 4E, step S210 is performed to form a doping layer 226 on the body portion 224b of the barrier layer 224 and the exposed portions of the channel material layer 222. The doping layer 226 may be conformally formed on the structure shown in FIG. 4D, and in contact with the body portion 224b of the barrier layer 224 and the exposed portions of the channel material layer 222.

Figure 4F:
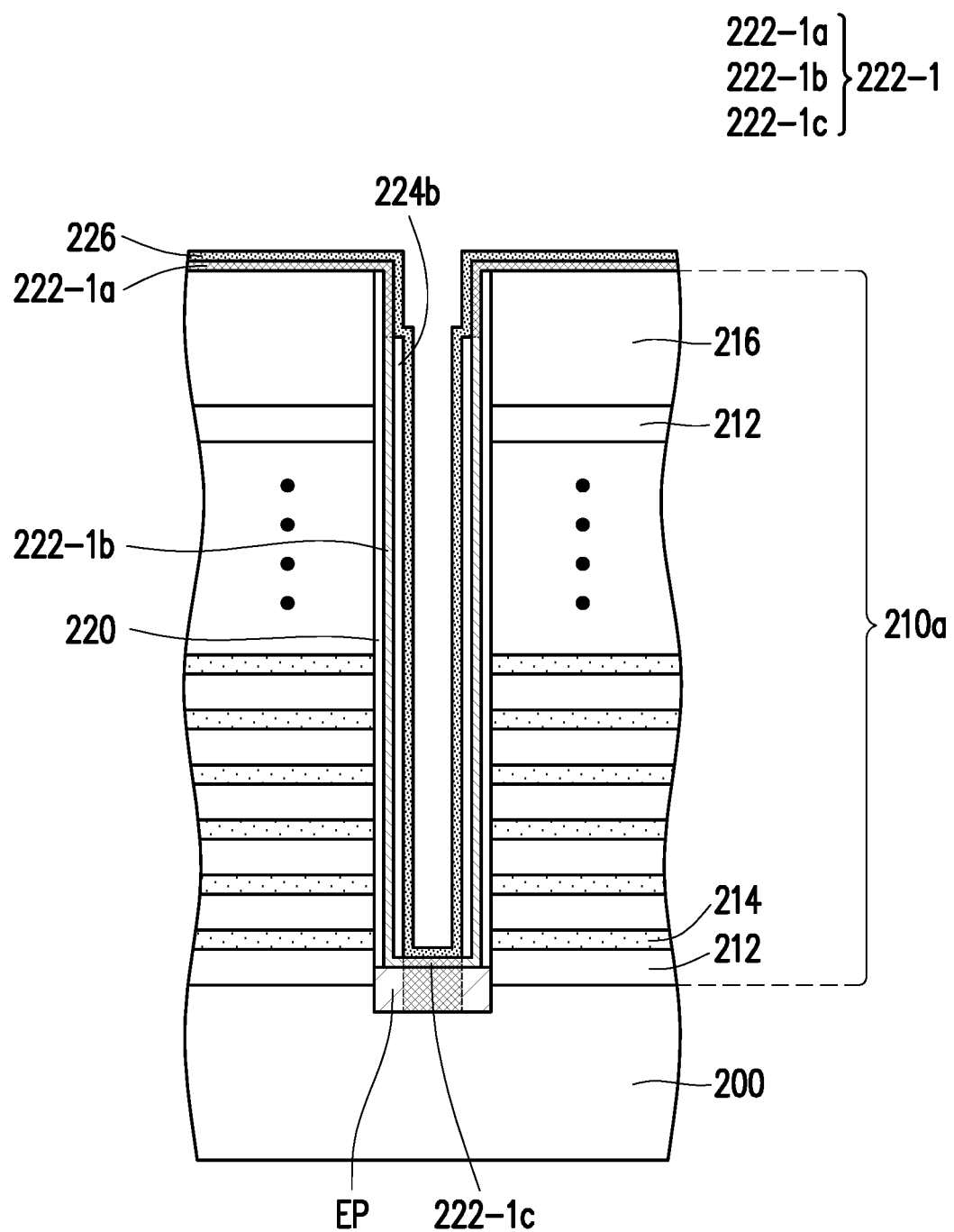

Referring to FIG. 3 and FIG. 4F, step S212 is performed to perform a heat treatment. As a result, dopants in the doping layer 226 can be diffused and driven into the exposed portions of the channel material layer 222, so as to dope the exposed portions of the channel material layer 222. The doped channel material layer 222 can be indicated as a channel layer 222-1. A top portion 222-1a and a bottom portion 222-1c of the channel layer 222-1 are doped in step S212. In some embodiments, the dopants in the doping layer 226 may be further diffused into the epitaxial layer EP via the bottom portion 222-1c of the channel layer 222-1, such that at least a portion of the epitaxial layer EP is doped (as shown by the dotted area of the epitaxial layer EP in FIG. 4F). In other embodiments, the dopants in the doping layer 226 are diffused and driven into the epitaxial layer EP, and the entire epitaxial layer EP is doped. On the other hand, the body portion 224b of the barrier layer 224 covers a body portion 222-1b of the channel layer 222-1 to block the dopants from diffusing and driving into the body portion 222-1b of the channel layer 222-1. Therefore, the body portion 222-1b of the channel layer 222-1 is not doped in step S212. Therefore, dopant concentrations of the top portion 222-1a and the bottom portion 222-1c of the channel layer 222-1 may respectively be higher than a dopant concentration of the body portion 222-1b. In some embodiments, a dopant concentration of the epitaxial layer EP may approximate the dopant concentrations of the top portion 222-1a and the bottom portion 222-1c of the channel layer 222-1 and may also be greater than the dopant concentration of the body portion 222-1b of the channel layer 222-1. For instance, the dopant concentration of the epitaxial layer EP may range from $10^{17}$ atoms/cm$^3$ to $10^{21}$ atoms/cm$^3$.

Locations of the top portion 222-1a, the bottom portion 222-1c and the body portion 222-1b of the channel layer 222-1 as shown in FIG. 4F would be respectively overlapped with locations of the top portion 224a, the bottom portion 224c, and the body portion 224b of the barrier layer 224 as shown in FIG. 4D. In other words, top portion 222-1a of the channel layer 222-1 covers the top surfaces of the stacked structures 210a and may be extended onto the sidewall of the cap layer 216. The bottom portion 222-1c of the channel layer 222-1 covers the top surface of the epitaxial layer EP, and in some embodiments, may be extended upward onto sidewalls of the bottommost first material layers 212 (or extended to the sidewalls of the bottommost first material layers 212 and the bottommost second material layers 214). The body portion 222-1b of the channel layer 222-1 is connected between the top portion 222-1a and the bottom portion 222-1c.

Figure 4G:
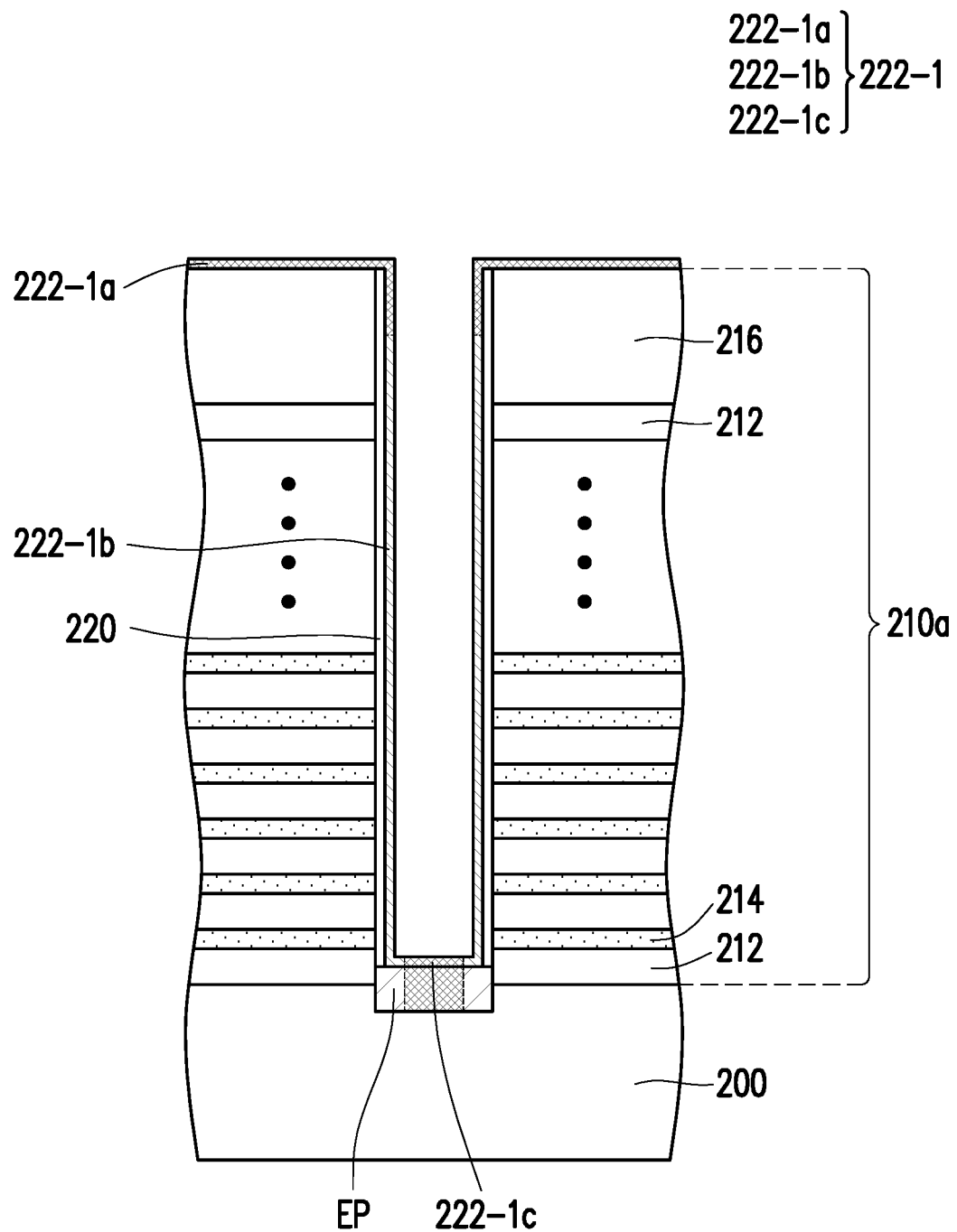

Referring to FIG. 3 and FIG. 4G, step S214 is performed to remove the doping layer 226 and the body portion 224b of the barrier layer 224. As a result, each portion of the channel layer 222-1 can be exposed.

Figure 4H:
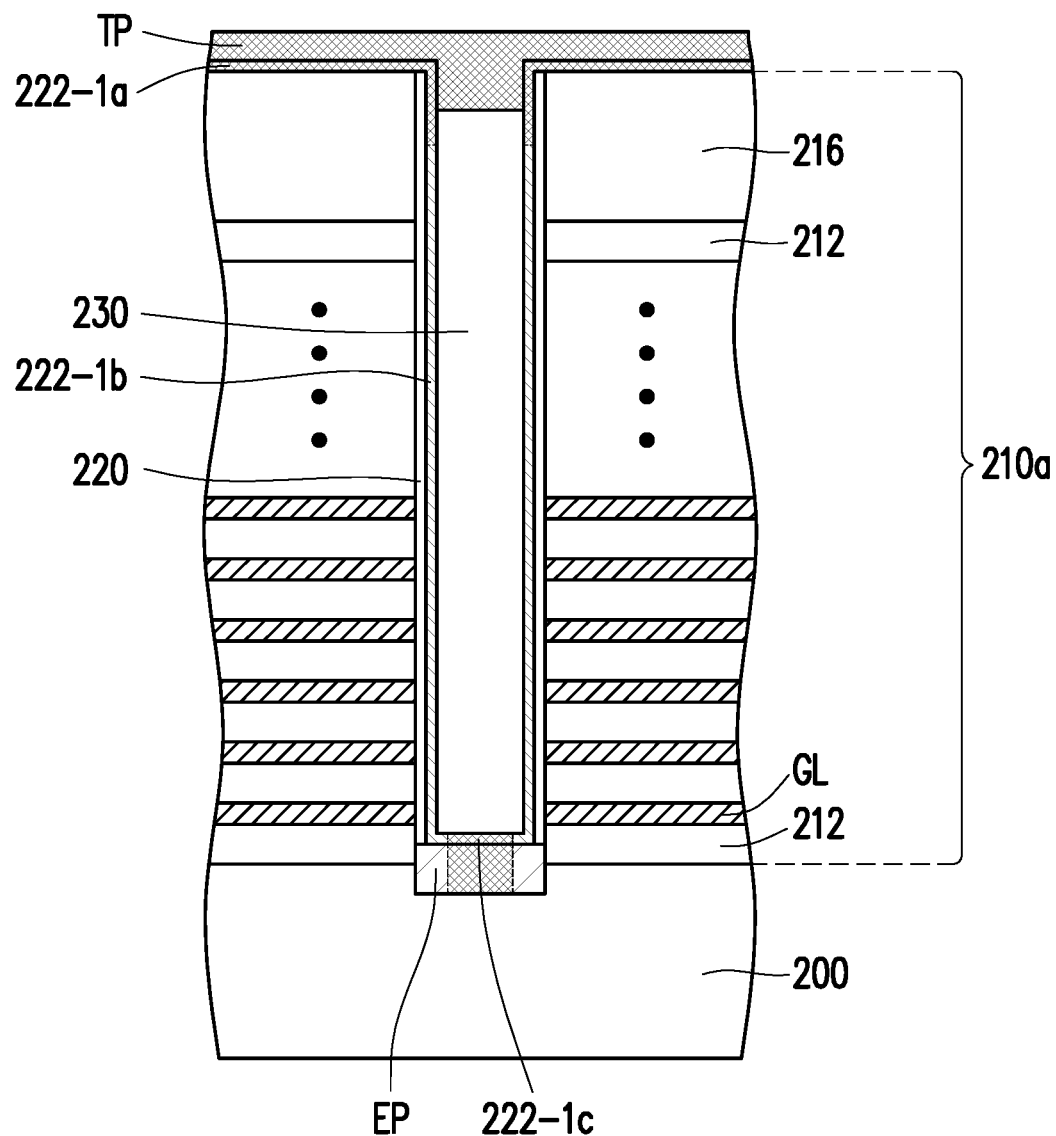

Referring to FIG. 3 and FIG. 4H, in some embodiments, step S215 may be performed to replace the second material layers 214 by a plurality of gate layers GL. In some embodiments, the method of replacing the second material layers 214 by the gate layers GL includes removing the second material layers 214. For instance, the second material layers 214 may be removed by an isotropic etching method. Since the second material layers 214 and the first material layers 212 have etch selectivity to each other, the first material layers 212 can be kept when the second material layers 214 are removed. Next, the gate layers GL are formed at locations formerly occupied by the second material layers 214 (i.e., locations between each pair of first material layers 212). A material of the gate layer GL may include a metal material, such as tungsten. Moreover, in some embodiments, a work function layer (not shown) may be first formed at the locations formerly occupied by the second material layers 214, and then the gate layers GL are formed. A method of forming the work function layer and the gate layers GL can include a chemical vapor deposition method.

Moreover, in some embodiments, step S216 may be performed to sequentially form an isolation structure 230 and an upper pad TP between adjacent stacked structures 210a. In some embodiments, a top surface of the isolation structure 230 may be lower than the top surfaces of the stacked structures 210a (such as the top surfaces of the cap layers 216). The upper pad TP is disposed on the isolation structure 230. In some embodiments, the upper pad TP may be further extended onto the top surfaces of the stacked structures 210a to cover the top portion 222-1a of the channel layer 222-1. In some embodiments, a material of the upper pad TP may be the same as the material of the channel layer 222-1. Moreover, a dopant concentration of the upper pad TP may substantially be equal to the dopant concentration of the channel layer 222-1. The method of forming the isolation structure 230 and the upper pad TP may include a chemical vapor deposition method.

In some embodiments, step S215 may precede step S216. In some other embodiments, step S216 may precede step S215. Embodiments of the invention are not limited to the order of step S215 and step S216.

Figure 4I:
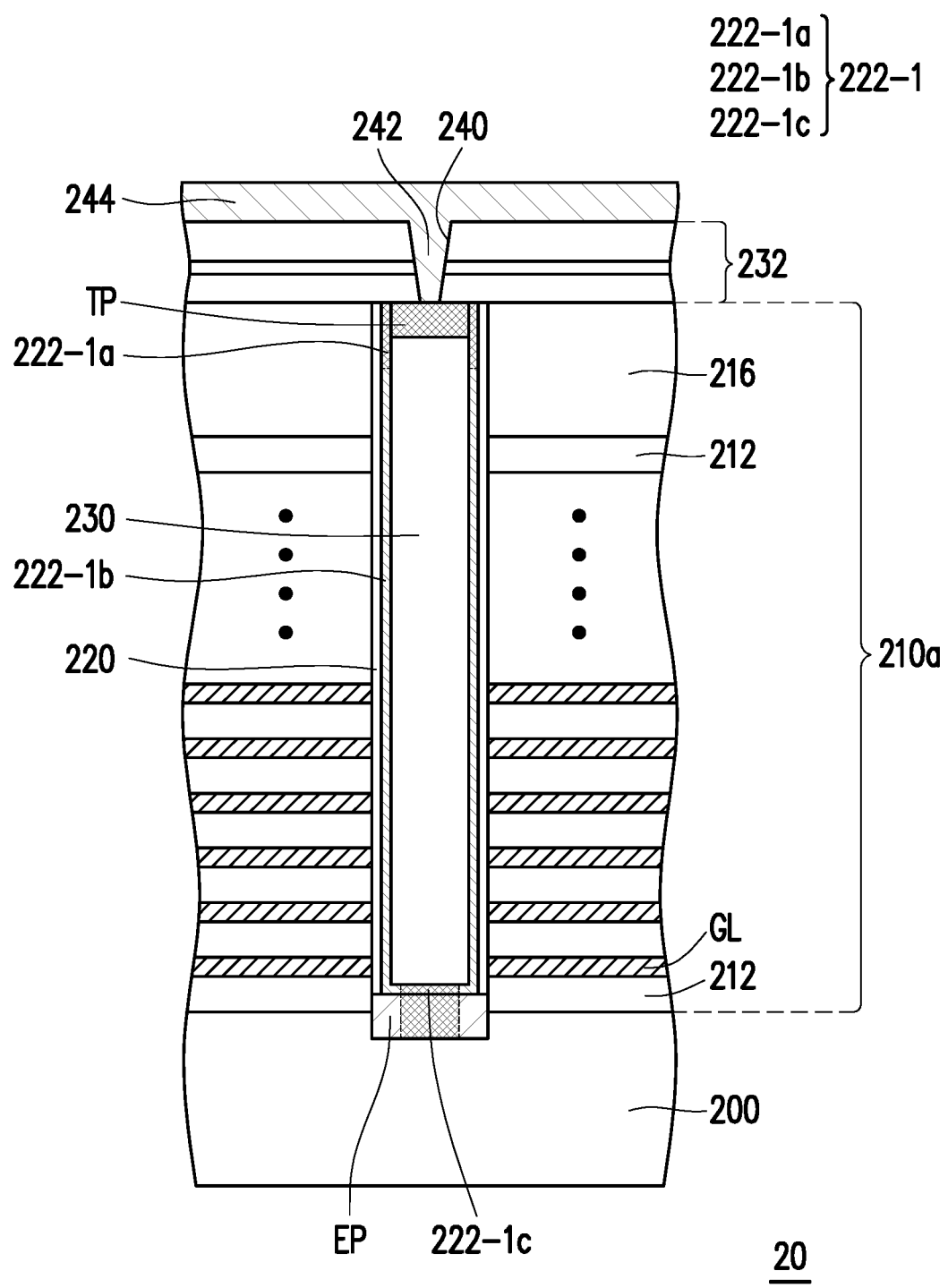

Referring to FIG. 4I, then step S217 may be performed, to perform a planarization process. In step S217, portions of the upper pad TP and the top portion 222-1a of the channel layer 222-1 are removed via the planarization process to expose the top surfaces of the stacked structures 210a (such as the top surfaces of the cap layers 216). As a result, top surfaces of the remaining upper pad TP and top portion 222-1a of the channel layer 222-1 may substantially be level with the top surfaces of the stacked structures 210a (such as the top surfaces of the cap layers 216). In some embodiments, the planarization process is, for instance, a chemical mechanical polishing process.

Next, step S218 may be performed to form a conductive plug 242 and a signal line 244. Before the conductive plug 242 and the signal line 244 are formed, a dielectric layer 232 may be formed on the stacked structures 210a and the upper pad TP. For instance, the dielectric layer 232 may be a single layer or a multilayer structure, which includes one or more dielectric material layers. Moreover, the dielectric layer 232 may be patterned to form a plug opening 240 exposing the upper pad TP. Next, the conductive plug 242 may be formed in the plug opening 240, and a signal line 244 may be formed on the dielectric layer 232. Although FIG. 4I only shows a single layer of the signal line 244, the signal line 244 may actually include a source line and a bit line located at different layers. Moreover, an interlayer dielectric layer (not shown) may be formed between the source line and the bit line. In some embodiments, the stacked structures 210a arranged along a direction parallel to the surface of the substrate 200 may be alternately coupled to the source line and the bit line via the top portion 222-1a of the channel layer 222-1. In some embodiments, an extending direction of at least one of the word line (such as the gate layers GL), the bit line, and the source line may be different from or perpendicular to extending directions of the other two. At this point, the manufacture of the memory device 20 of embodiments of the invention is complete.

Based on the above, the channel layer of the memory device has a top portion and a bottom portion having high dopant concentrations, and has a body portion having a dopant concentration significantly less than those of the top portion and the bottom portion. Since the top portion and the bottom portion of the channel layer are doped to have high dopant concentrations, the overall resistance of the channel layer can be effectively reduced. As a result, even if the depth of the recess between certain stacked structures is too large, the operation current of the channel layer can still be maintained. Moreover, in some embodiments, the issue of open circuit to the channel layer corresponding to those certain stacked structures can be further prevented. Moreover, since the top portion of the channel layer has a high dopant concentration (i.e., low resistance), the contact resistance between the channel layer and the conductive plug subsequently formed thereon can be reduced. On the other hand, during doping the top portion and the bottom portion of the channel layer, the remaining portion of the barrier layer (i.e., the body portion of the barrier layer) can prevent the dopant from diffusing and driving into the body portion of the channel layer, such that the body portion of the channel layer covering the sidewalls of the memory units maintains a relatively low dopant concentration. Accordingly, during operation of the memory device, the occurrence of the dopants inside the body portion of the channel layer diffusing toward the memory units can be reduced. As a result, a reliability of the memory device can be ensured.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a memory device, comprising:
    forming a pair of stacked structures on a substrate, wherein each of the stacked structures comprises a plurality of first material layers and a plurality of second material layers alternately stacked on the substrate, and comprises a cap layer located on the plurality of first material layers and the plurality of second material layers;
    forming a charge storage layer on sidewalls of the pair of stacked structures that are facing each other; and
    forming a channel layer on the charge storage layer, wherein the channel layer has a top portion, a body portion, and a bottom portion, the top portion covers sidewalls of the cap layers of the pair of stacked structures that are facing each other, the bottom portion covers a portion of the substrate located between the pair of stacked structures, the body portion is connected between the top portion and the bottom portion, and dopant concentrations of the top portion and the bottom portion are respectively higher than a dopant concentration of the body portion,
    wherein a method of forming the channel layer comprises: sequentially forming a channel material layer and a barrier layer on the charge storage layer; patterning the barrier layer, such that the patterned barrier layer exposes a portion of the channel material layer located between the pair of stacked structures and substantially parallel to a main surface of the substrate, and exposes another portion of the channel material layer covering the cap layer; doping the exposed portions of the channel material layer to form the channel layer; and removing the patterned barrier layer.

2. The manufacturing method of the memory device of claim 1, wherein a method of doping the channel material layer comprises:
    forming a doping layer on the patterned barrier layer and the exposed portions of the channel material layer;
    performing a heat treatment, such that dopants in the doping layer enters the exposed portions of the channel material layer to form the channel layer; and
    removing the doping layer.

3. The manufacturing method of the memory device of claim 1, wherein a method of patterning the barrier layer comprises an anisotropic etching.

4. The manufacturing method of the memory device of claim 1, wherein each of the first material layers is a gate layer, each of the second material layers is an insulating layer, and the cap layer comprises a top gate layer.

5. The manufacturing method of the memory device of claim 4, wherein each of the stacked structures further comprises a bottom gate layer, the bottom gate layer is located on the substrate, and the plurality of first material layers and the plurality of second material layers are formed on the bottom gate layer.

6. The manufacturing method of the memory device of claim 4, further comprising forming an isolation structure between the pair of stacked structures after the channel layer is formed.

7. The manufacturing method of the memory device of claim 1, wherein a material of the plurality of first material layers and a material of the plurality of second material layers are both insulating materials and have an etch selectivity to each other.

8. The manufacturing method of the memory device of claim 7, further comprising forming an epitaxial layer before the charge storage layer is formed, wherein the epitaxial layer is disposed on the portion of the substrate located between the pair of stacked structures.

9. The manufacturing method of the memory device of claim 7, further comprising sequentially forming an isolation structure and an upper pad between the pair of stacked structures after the channel layer is formed, wherein the top portion of the channel layer is located at a sidewall of the upper pad, and wherein the body portion and the bottom portion of the channel layer are respectively located at a sidewall and a bottom surface of the isolation structure.

10. The manufacturing method of the memory device of claim 7, further comprising replacing the plurality of second material layers by a plurality of gate structures after the channel layer is formed.

11. A memory device, comprising:
    a pair of stacked structures, disposed on a substrate, wherein each of the stacked structures comprises a plurality of gate layers and a plurality of insulating layers alternately stacked on the substrate and comprises a cap layer located on the plurality of gate layers and the plurality of insulating layers;
    a charge storage layer, disposed on sidewalls of the pair of stacked structures that are facing each other; and
    a channel layer, covering the charge storage layer, wherein the channel layer has a top portion, a body portion, and a bottom portion, the top portion covers sidewalls of the cap layers of the pair of stacked structures that are facing each other, the bottom portion covers a portion of the substrate located between the pair of stacked structures, the body portion is connected between the top portion and the bottom portion, dopant concentrations of the top portion and the bottom portion are respectively higher than a dopant concentration of the body portion, and the charge storage layer continuously extends under the bottom portion of the channel layer.

12. The memory device of claim 11, wherein the top portion of the channel layer further covers a top surface of the cap layer.

13. The memory device of claim 11, wherein the stacked structure further comprises a bottom gate layer, the bottom gate layer is located on the substrate, and the plurality of gate layers and the plurality of insulating layers are located on the bottom gate layer.

14. The memory device of claim 11, further comprising an isolation structure, disposed on the portion of the substrate located between the pair of stacked structures, wherein the channel layer is located at a sidewall and a bottom surface of the isolation structure.

* * * * *